US011741276B1

(12) United States Patent
Brien

(10) Patent No.: US 11,741,276 B1
(45) Date of Patent: Aug. 29, 2023

(54) SYSTEMS AND METHODS FOR MODELING LIVE EVENTS

(71) Applicant: DK Crown Holdings Inc., Boston, MA (US)

(72) Inventor: Barnaby Peter Brien, London (GB)

(73) Assignee: DK Crown Holdings Inc., Boston, MA (US)

( * ) Notice: Subject to any disclaimer, the term of this patent is extended or adjusted under 35 U.S.C. 154(b) by 0 days.

(21) Appl. No.: 18/067,364

(22) Filed: Dec. 16, 2022

(51) Int. Cl.
*G06F 9/46* (2006.01)
*G06F 30/20* (2020.01)

(52) U.S. Cl.
CPC .............. *G06F 30/20* (2020.01); *G06F 9/46* (2013.01)

(58) Field of Classification Search
CPC ....................................................... G06F 9/46
See application file for complete search history.

(56) References Cited

U.S. PATENT DOCUMENTS

2008/0243463 A1\* 10/2008 Lovas .................... G06Q 10/04
703/17
2017/0262818 A1\* 9/2017 Horrell ................ G06Q 10/067

\* cited by examiner

*Primary Examiner* — Charlie Sun
(74) *Attorney, Agent, or Firm* — Foley & Lardner LLP

(57) ABSTRACT

Systems and methods for modeling live events are disclosed. A system can maintain results of simulations of a plurality of live events. The results can correspond to a plurality of conditional events that occur during each simulation. The system can receive selections of candidate outcomes for the conditional events to occur during a live event from a computing device, and identify a subset of the simulations having outcomes that correspond to the selections of the candidate outcomes. The system can generate an odds value based on a number of simulations in the subset and the total number of simulations for the live event, and can provide the odds value for presentation at the computing device.

20 Claims, 14 Drawing Sheets

| Player | Anytime Odds |
|---|---|
| Marcus Mariota | 4.15 |
| Cordarrelle Patterson | 1.6 |
| Damien Williams | 3.37 |
| Tyler Allgeier | 7.96 |
| Drake London | 1.94 |
| Auden Tate | 2.63 |
| Bryan Edwards | 5.44 |
| Kyle Pitts | 2.45 |
| Falcons DST | 6.46 |
| Lamar Jackson | 4.54 |
| JK Dobbins | 1.75 |
| Gus Edwards | 3.68 |
| Mike Davis | 8.71 |
| James Proche | 2.12 |
| Devin Duvernay | 2.88 |
| Rashod Bateman | 5.95 |
| Mark Andrews | 2.68 |
| Ravens DST | 7.06 |

310A — 1st TD

Bet Slip (315A)

1st TD Scorer
Cordarrelle Patterson

Odds: 9.67

300B

| Player | Anytime Odds |
|---|---|
| Marcus Mariota | 4.15 |
| Cordarrelle Patterson | 1.6 |
| Damien Williams | 3.37 |
| Tyler Allgeier | 7.96 |
| Drake London | 1.94 |
| Auden Tate | 2.63 |
| Bryan Edwards | 5.44 |
| Kyle Pitts | 2.45 |
| Falcons DST | 6.46 |
| Lamar Jackson | 4.54 |
| JK Dobbins | 1.75 |
| Gus Edwards | 3.68 |
| Mike Davis | 8.71 |
| James Proche | 2.12 |
| Devin Duvernay | 2.88 |
| Rashod Bateman | 5.95 |
| Mark Andrews | 2.68 |
| Ravens DST | 7.06 |

1st TD

Bet Slip

1st TD Scorer
Cordarrelle Patterson
Auden Tate
Bryan Edwards

Odds: 5.03

| Player | Anytime Odds | 1st TD | 2nd TD | 3rd TD |
|---|---|---|---|---|
| Marcus Mariota | 4.15 | | | |
| Cordarrelle Patterson | 1.6 | ■ | ■ | ■ |
| Damien Williams | 3.37 | | | |
| Tyler Allgeier | 7.96 | | | |
| Drake London | 1.94 | | | |
| Auden Tate | 2.63 | | | |
| Bryan Edwards | 5.44 | | | |
| Kyle Pitts | 2.45 | | | |
| Falcons DST | 6.46 | | | |
| Lamar Jackson | 4.54 | | | |
| JK Dobbins | 1.75 | | | |
| Gus Edwards | 3.68 | | | |
| Mike Davis | 8.71 | | | |
| James Proche | 2.12 | | | |
| Devin Duvernay | 2.88 | | | |
| Rashod Bateman | 5.95 | | | |
| Mark Andrews | 2.68 | | | |
| Ravens DST | 7.06 | | | |

Bet Slip — 315C

| 1st TD Scorer | Cordarrelle Patterson |
| 2nd TD Scorer | Cordarrelle Patterson |
| 3rd TD Scorer | Cordarrelle Patterson |

Odds: 903.59

| Player | Anytime Odds | | 1st TD | 2nd TD | 3rd TD | | Bet Slip |
|---|---|---|---|---|---|---|---|
| Marcus Mariota | 4.15 | | | | | | 1st TD Scorer |
| Cordarrelle Patterson | 1.6 | | ■ | | | | Cordarrelle Patterson |
| Damien Williams | 3.37 | | | | | | Drake London |
| Tyler Allgeier | 7.96 | | | | | | Lamar Jackson |
| Drake London | 1.94 | | ■ | | | | JK Dobbins |
| Auden Tate | 2.63 | | | | | | Devin Duvernay |
| Bryan Edwards | 5.44 | | | | | | |
| Kyle Pitts | 2.45 | | | | | | 2nd TD Scorer |
| Falcons DST | 6.46 | | | | | | Cordarrelle Patterson |
| Lamar Jackson | 4.54 | | ■ | ■ | | | Drake London |
| JK Dobbins | 1.75 | | ■ | ■ | | | Lamar Jackson |
| Gus Edwards | 3.68 | | | | | | JK Dobbins |
| Mike Davis | 8.71 | | | | | | Devin Duvernay |
| James Proche | 2.12 | | | | | | |
| Devin Duvernay | 2.88 | | | | ■ | | 3rd TD Scorer |
| Rashod Bateman | 5.95 | | | | | | Cordarrelle Patterson |
| Mark Andrews | 2.68 | | | | | | Drake London |
| Ravens DST | 7.06 | | | | | | Lamar Jackson |
| | | | | | | | JK Dobbins |
| | | | | | | | Devin Duvernay |
| | | | | | | | |
| | | | | | | | Odds: 20.91 |

FIG. 3D

| Player | Anytime Odds | 1st TD | 2nd TD | 3rd TD |
|---|---|---|---|---|
| Ryan Tannehill | 4.15 | | | |
| Derrick Henry | 1.6 | ■ | | ■ |
| Hassan Haskins | 3.37 | | | |
| Dontrell Hilliard | 7.96 | | | |
| Nick Westbrook-Ikhine | 1.94 | | | |
| Treylon Burks | 2.63 | | | |
| Robert Woods | 5.44 | | | |
| Austin Hooper | 2.45 | | | |
| Titans DST | 6.46 | | | |
| Patrick Mahomes | 4.54 | | ■ | |
| Clyde Edwards-Helaire | 1.75 | | ■ | |
| Ronald Jones | 3.68 | | ■ | |
| Derrick Gore | 8.71 | | ■ | |
| Marquez Valdes-Scantling | 2.12 | | ■ | |
| Mecole Hardman | 2.88 | | ■ | |
| JuJu Smith-Schuster | 5.95 | | ■ | |
| Travis Kelce | 2.68 | | ■ | |
| Chiefs DST | 7.06 | | ■ | |

Bet Slip

1st TD Scorer
Derrick Henry

2nd TD Scorer
Patrick Mahomes
Clyde Edwards-Helaire
Ronald Jones
Derrick Gore
Marquez Valdes-Scantling
Mecole Hardman
JuJu Smith-Schuster
Travis Kelce
Chiefs DST 3rd TD Scorer
Derrick Henry Odds: 276.01

FIG. 3F

| Player | Anytime Odds | 1st TD | 2nd TD | 3rd TD | 4th TD |
|---|---|---|---|---|---|
| Dak Prescott | 4.15 | | | | |
| Ezekiel Elliott | 1.6 | ■ | ■ | ■ | ■ |
| Tony Pollard | 3.37 | | | | |
| Rico Dowdle | 7.96 | | | | |
| Michael Gallup | 1.94 | ■ | ■ | ■ | ■ |
| CeeDee Lamb | 2.63 | | | | |
| James Washington | 5.44 | | | ■ | ■ |
| Dalton Schultz | 2.45 | | | | |
| Cowboys DST | 6.46 | | | | |
| Sam Darnold | 4.54 | | | | |
| Christian McCaffrey | 1.75 | | | | |
| Chuba Hubbard | 3.68 | | ■ | ■ | ■ |
| D'Onta Foreman | 8.71 | | | | |
| DJ Moore | 2.12 | ■ | ■ | ■ | ■ |
| Terrace Marshall | 2.88 | | | | |
| Robby Anderson | 5.95 | | | | |
| Tommy Tremble | 2.68 | | | | |
| Panthers DST | 7.06 | | ■ | ■ | ■ |

Bet Slip

1st TD Scorer
Ezekiel Elliott
Michael Gallup
DJ Moore

2nd TD Scorer
Ezekiel Elliott
Michael Gallup
Chuba Hubbard
DJ Moore
Panthers DST 3rd TD Scorer
Ezekiel Elliott
Michael Gallup
James Washington
Chuba Hubbard
DJ Moore
Panthers DST 4th TD Scorer
Ezekiel Elliott
Michael Gallup
James Washington
Chuba Hubbard
DJ Moore
Panthers DST Odds: 131.43

FIG. 3G

SYSTEMS AND METHODS FOR MODELING LIVE EVENTS

BACKGROUND

Content management systems allocate and utilize large amounts of computing resources to communicate and process data from a large number of remote computing devices. When serving a large number of mobile devices, memory and processing power are finite resources. Therefore, it is challenging to appropriately distribute and process information from a large number of devices.

SUMMARY

The systems and methods of this technical solution provide techniques for modeling live events using results produced from simulations of the live events. Existing technical solutions that utilize computers to model live events implement brute-force approaches to calculate probabilities of combinations of outcomes that may occur during the live events. The brute-force approaches include individually and iteratively processing and computing the probability of each combination of all possible outcomes that may occur during the live event. Computer-based brute-force approaches, however, become computationally impracticable as the number of combinations of occurrences during live events increases. In particular, the memory and computational resources required increase exponentially as the number of possible combinations increases. To address these and other issues, the systems and methods described herein utilize results produced from simulations to estimate the probability of combinations of events requested via client devices. Rather than brute-force computing the probability of the combination of events each time a request is received, the techniques described herein can utilize computer-based filtering approaches that filter results produced from executed simulations of live events to estimate probabilities of requested combinations. This reduces the computational resources required to process requests from large numbers of client devices, making computer-based computation of such events practical to perform in response to requests from client devices. These and other improvements are described in further detail herein.

At least one aspect of the present disclosure relates to a method for modeling live events. The method can be performed by one or more processors coupled to a non-transitory memory. The method can include maintaining, for each simulation of a plurality of simulations of a live event, a plurality of results corresponding to a plurality of conditional events that occur during the simulation. The method can include receiving, via a user interface presented at a computing device, a first selection identifying a first plurality of candidate outcomes for a first conditional event of the plurality of conditional events to occur during the live event and a second selection identifying a second candidate outcome for a second conditional event of the plurality of conditional events to occur during the live event. The method can include identifying, from the plurality of simulations, a subset of simulations having a subset of the plurality of results that include (i) any of the first plurality of candidate outcomes and (ii) the second candidate outcome. The second conditional event can occur subsequent to the first conditional event. The method can include generating an odds value based on a first number of simulations included in the subset of simulations and a second number of simulations included in the plurality of simulations. The method can include providing the odds value for presentation at the user interface at the computing device.

In some implementations, maintaining the plurality of results can include maintaining a data structure including the plurality of results stored in association with respective identifiers of each of the plurality of conditional events. In some implementations, identifying the subset of simulations can include filtering the data structure based on the first plurality of candidate outcomes to generate an initial subset of simulations. In some implementations, identifying the subset of simulations can include filtering the initial subset of simulations based on the second candidate outcome to generate the subset of simulations.

In some implementations, each result of the plurality of results can include a respective counter value corresponding to a count of outcomes during the plurality of simulations. In some implementations, identifying the subset of simulations can include identifying, by the one or more processors, the respective counter value of each of the plurality of results that indicates (i) any of the first plurality of candidate outcomes or (ii) the second candidate outcome. In some implementations, the method can further include generating, by the one or more processors, the plurality of results by executing the plurality of simulations of the live event.

In some implementations, generating the plurality of results can include updating, by the one or more processors, a respective counter value for each of the plurality of conditional events based on a respective output of the plurality of simulations. In some implementations, the plurality of simulations can be executed as an offline process. In some implementations, the first selection of the first plurality of candidate outcomes can include a selection of a plurality of players for the first conditional event of the live event.

In some implementations, identifying the subset of simulations can be further based on the plurality of players. In some implementations, the method can include providing instructions to display the user interface. In some implementations, the user interface can include a plurality of actionable objects. In some implementations, the first selection that identifies the first plurality of candidate outcomes is provided responsive to respective interactions with a subset of the plurality of actionable objects. In some implementations, the plurality of actionable objects are arranged in a first column at the user interface, and a second plurality of actionable objects corresponding to the second conditional event are arranged in a second column in the user interface.

At least one other aspect of the present disclosure relates to a system for modeling live events. The system can include one or more processors coupled to a non-transitory memory. The system can maintain, for each simulation of a plurality of simulations of a live event, a plurality of results corresponding to a plurality of conditional events that occur during the simulation. The system can receive, via a user interface presented at a computing device, a first selection identifying a first plurality of candidate outcomes for a first conditional event of the plurality of conditional events to occur during the live event and a second selection identifying a second candidate outcome for a second conditional event of the plurality of conditional events to occur during the live event. The second conditional event can occur subsequent to the first conditional event. The system can identify, from the plurality of simulations, a subset of simulations having a subset of the plurality of results that include (i) any of the first plurality of candidate outcomes and (ii) the second candidate outcome. The system can generate an odds value based on a first number of simulations included in the subset of simulations and a second number of simulations included in the plurality of simulations. The system can provide the odds value for presentation at the user interface at the computing device.

In some implementations, maintaining the plurality of results can include maintaining a data structure including the plurality of results stored in association with respective identifiers of each of the plurality of conditional events. In some implementations, identifying the subset of simulations can include filtering the data structure based on the first plurality of candidate outcomes to generate an initial subset of simulations. In some implementations, identifying the subset of simulations can include filtering the initial subset of simulations based on the second candidate outcome to generate the subset of simulations. In some implementations, each result of the plurality of results can include a respective counter value corresponding to a count of outcomes during the plurality of simulations.

In some implementations, identifying the subset of simulations can include identifying, by the one or more processors, the respective counter value of each of the plurality of results that indicates (i) any of the first plurality of candidate outcomes or (ii) the second candidate outcome. In some implementations, the system can generate the plurality of results by executing the plurality of simulations of the live event. In some implementations, generating the plurality of results can include updating, by the one or more processors, a respective counter value for each of the plurality of conditional events based on a respective output of the plurality of simulations.

In some implementations, the plurality of simulations can be executed as an offline process. In some implementations, the first selection of the first plurality of candidate outcomes can include a selection of a plurality of players for the first conditional event of the live event. In some implementations, identifying the subset of simulations can be further based on the plurality of players. In some implementations, the system can provide instructions to display the user interface. In some implementations, the user interface can include a plurality of actionable objects. In some implementations, the first selection that identifies the first plurality of candidate outcomes is provided responsive to respective interactions with a subset of the plurality of actionable objects. In some implementations, the plurality of actionable objects are arranged in a first column at the user interface, and a second plurality of actionable objects corresponding to the second conditional event are arranged in a second column in the user interface.

These and other aspects and implementations are discussed in detail below. The foregoing information and the following detailed description include illustrative examples of various aspects and implementations and provide an overview or framework for understanding the nature and character of the claimed aspects and implementations. The drawings provide illustration and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form, for example, by appropriate computer programs, which may be carried on appropriate carrier media (computer readable media), which may be tangible carrier media (e.g., disks) or intangible carrier media (e.g., communications signals). Aspects may also be implemented using any suitable apparatus, which may take the form of programmable computers running computer programs arranged to implement the aspect. As used in the specification and in the claims, the singular forms of 'a,' 'an,' and 'the' include plural referents unless the context clearly dictates otherwise.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIGS. 3A, 3B, 3C, 3D, 3E, 3F, 3G, and 3H illustrate example user interfaces showing combinations of conditional events and their resulting probabilities as generated by the system of FIG. 2, in accordance with one or more implementations.

DETAILED DESCRIPTION

Below are detailed descriptions of various concepts related to, and implementations of, techniques, approaches, methods, apparatuses, and systems for modeling live events. The various concepts introduced above and discussed in greater detail below may be implemented in any of numerous ways, as the described concepts are not limited to any particular manner of implementation. Examples of specific implementations and applications are provided primarily for illustrative purposes.

For purposes of reading the description of the various implementations below, the following descriptions of the sections of the Specification and their respective contents may be helpful:

Section A describes a network environment and computing environment which may be useful for practicing embodiments described herein; and Section B describes systems and methods for modeling live events.

A. Computing and Network Environment

Figure 1A:
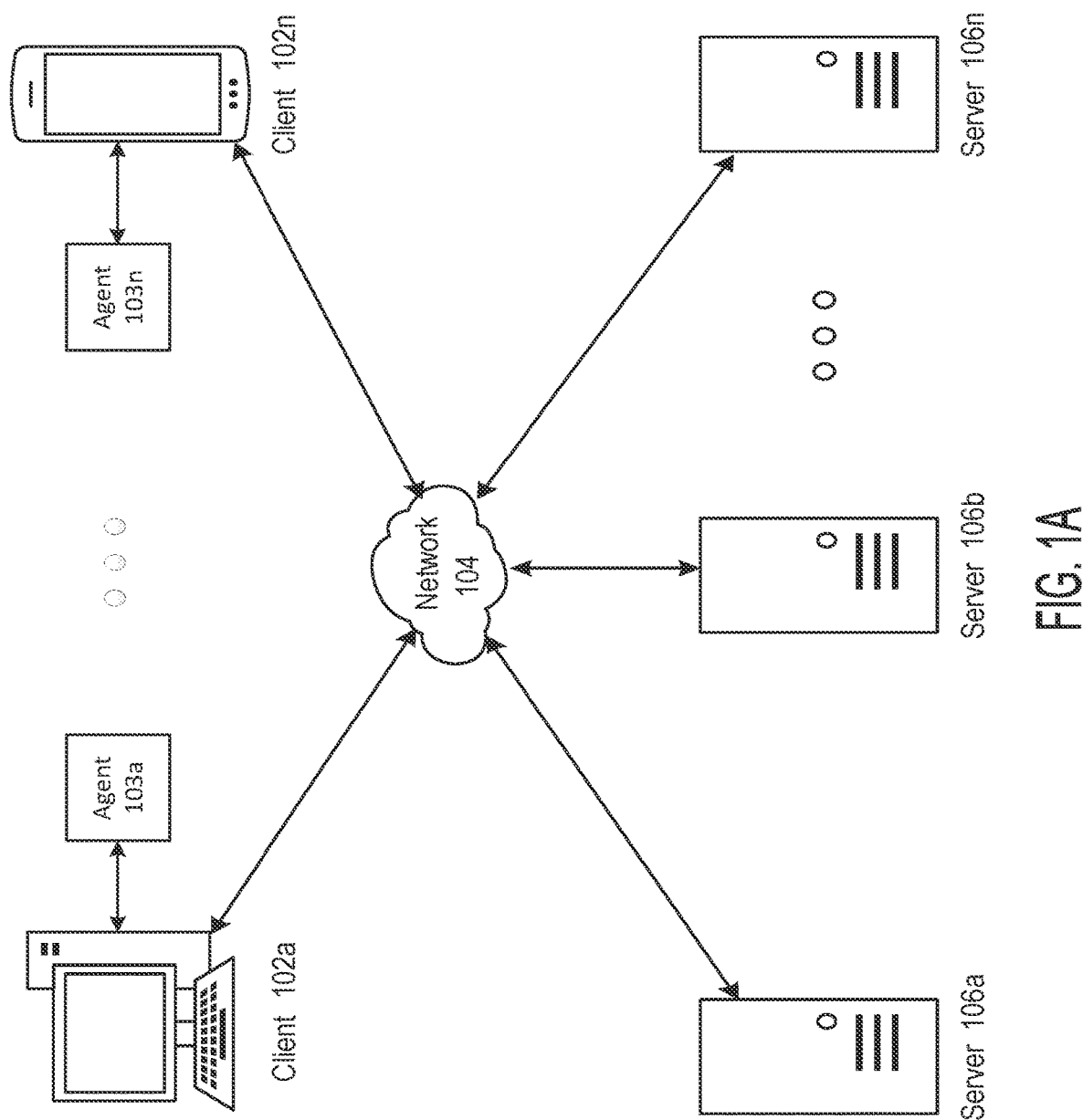
FIG. 1A is a block diagram depicting an embodiment of a network environment comprising a client device in communication with a server device.

Prior to discussing specific implements of the various aspects of this technical solution, it may be helpful to describe aspects of the operating environment as well as associated system components (e.g., hardware elements) in connection with the methods and systems described herein. Referring to FIG. 1A, an embodiment of a network environment is depicted. In brief overview, the network environment includes one or more clients 102a-102n (also generally referred to as local machine(s) 102, client(s) 102, client node(s) 102, client machine(s) 102, client computer(s) 102, client device(s) 102, endpoint(s) 102, or endpoint node(s) 102) in communication with one or more agents 103a-103n and one or more servers 106a-106n (also generally referred to as server(s) 106, node 106, or remote machine(s) 106) via one or more networks 104. In some embodiments, a client 102 has the capacity to function as both a client node seeking access to resources provided by a server and as a server providing access to hosted resources for other clients 102a-102n.

Although FIG. 1A shows a network 104 between the clients 102 and the servers 106, the clients 102 and the servers 106 may be on the same network 104. In some embodiments, there are multiple networks 104 between the clients 102 and the servers 106. In one of these embodiments, a network 104' (not shown) may be a private network and a network 104 may be a public network. In another of these embodiments, a network 104 may be a private network and a network 104' may be a public network. In still another of these embodiments, networks 104 and 104' may both be private networks.

The network 104 may be connected via wired or wireless links. Wired links may include Digital Subscriber Line (DSL), coaxial cable lines, or optical fiber lines. The wireless links may include BLUETOOTH, Wi-Fi, Worldwide Interoperability for Microwave Access (WiMAX), an infrared channel, or satellite band. The wireless links may also include any cellular network standards used to communicate among mobile devices, including standards that qualify as 1G, 2G, 3G, 4G, or 5G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 4G standards may correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards may use various channel access methods, e.g., FDMA, TDMA, CDMA, or SDMA. In some embodiments, different types of data may be transmitted via different links and standards. In other embodiments, the same types of data may be transmitted via different links and standards.

The network 104 may be any type and/or form of network. The geographical scope of the network 104 may vary widely and the network 104 can be a body area network (BAN), a personal area network (PAN), a local area network (LAN) (e.g., Intranet), a metropolitan area network (MAN), a wide area network (WAN), or the Internet. The topology of the network 104 may be of any form and may include, e.g., any of the following: point-to-point, bus, star, ring, mesh, or tree. The network 104 may be an overlay network which is virtual and sits on top of one or more layers of other networks 104'. The network 104 may be of any such network topology as known to those ordinarily skilled in the art capable of supporting the operations described herein. The network 104 may utilize different techniques and layers or stacks of protocols, including, e.g., the Ethernet protocol, the internet protocol suite (TCP/IP), the ATM (Asynchronous Transfer Mode) technique, the SONET (Synchronous Optical Networking) protocol, or the SDH (Synchronous Digital Hierarchy) protocol. The TCP/IP internet protocol suite may include an application layer, transport layer, internet layer (including, e.g., IPv6), or link layer. The network 104 may be a type of a broadcast network, a telecommunications network, a data communication network, or a computer network.

In some embodiments, the system may include multiple, logically-grouped servers 106. In one of these embodiments, the logical group of servers may be referred to as a server farm (not shown) or a machine farm 38. In another of these embodiments, the servers 106 may be geographically dispersed. In other embodiments, a machine farm 38 may be administered as a single entity. In still other embodiments, the machine farm 38 includes a plurality of machine farms 38. The servers 106 within each machine farm 38 can be heterogeneous—one or more of the servers 106 or remote machines 106 can operate according to one type of operating system platform (e.g., WINDOWS NT, manufactured by Microsoft Corp. of Redmond, Wash.), while one or more of the other servers 106 can operate according to another type of operating system platform (e.g., Unix, Linux, or Mac OS X).

In one embodiment, servers 106 in the machine farm 38 may be stored in high-density rack systems, along with associated storage systems, and located in an enterprise data center. In this embodiment, consolidating the servers 106 in this way may improve system manageability, data security, the physical security of the system, and system performance by locating servers 106 and high performance storage systems on localized high performance networks 104. Centralizing the servers 106 and storage systems and coupling them with advanced system management tools allows more efficient use of server resources.

The servers 106 of each machine farm 38 do not need to be physically proximate to another server 106 in the same machine farm 38. Thus, the group of servers 106 logically grouped as a machine farm 38 may be interconnected using a wide area network (WAN) connection or a metropolitan area network (MAN) connection. For example, a machine farm 38 may include servers 106 physically located in different continents or different regions of a continent, country, state, city, campus, or room. Data transmission speeds between servers 106 in the machine farm 38 can be increased if the servers 106 are connected using a local area network (LAN) connection or some form of direct connection. Additionally, a heterogeneous machine farm 38 may include one or more servers 106 operating according to a type of operating system, while one or more other servers 106 execute one or more types of hypervisors rather than operating systems. In these embodiments, hypervisors may be used to emulate virtual hardware, partition physical hardware, virtualize physical hardware, and execute virtual machines that provide access to computing environments, allowing multiple operating systems to run concurrently on a host computer. Native hypervisors may run directly on the host computer. Hypervisors may include VMware ESX/ESXi, manufactured by VMWare, Inc., of Palo Alto, Calif.; the Xen hypervisor, an open source product whose development is overseen by Citrix Systems, Inc.; the HYPER-V hypervisors provided by Microsoft, or others. Hosted hypervisors may run within an operating system on a second software level. Examples of hosted hypervisors may include VMware Workstation and VIRTUALBOX.

Management of the machine farm 38 may be decentralized. For example, one or more servers 106 may comprise components, subsystems, and modules to support one or more management services for the machine farm 38. In one of these embodiments, one or more servers 106 provide functionality for management of dynamic data, including techniques for handling failover, data replication, and increasing the robustness of the machine farm 38. Each server 106 may communicate with a persistent store and, in some embodiments, with a dynamic store.

Server 106 may be a file server, application server, web server, proxy server, appliance, network appliance, gateway, gateway server, virtualization server, deployment server, SSL VPN server, or firewall. In one embodiment, the server 106 may be referred to as a remote machine or a node. In another embodiment, a plurality of nodes 106 may be in the path between any two communicating servers.

Figure 1B:
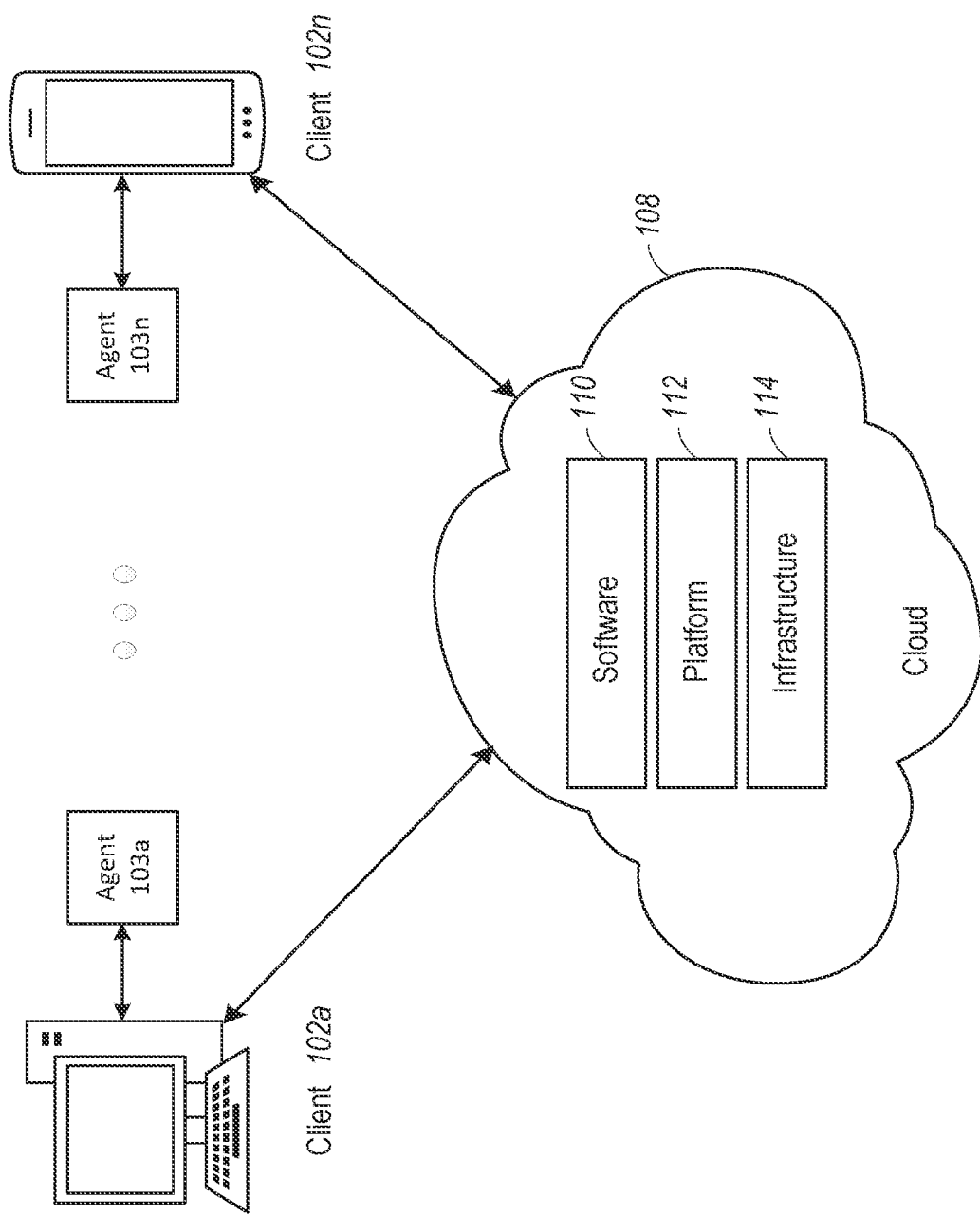
FIG. 1B is a block diagram depicting a cloud computing environment comprising a client device in communication with cloud service providers.

Referring to FIG. 1B, a cloud computing environment is depicted. A cloud computing environment may provide client 102 with one or more resources provided by a network environment. The cloud computing environment may include one or more clients 102a-102n, in communication with respective agents 103a-103n and with the cloud 108 over one or more networks 104. Clients 102 may include, e.g., thick clients, thin clients, and zero clients. A thick client may provide at least some functionality even when disconnected from the cloud 108 or servers 106. A thin client or a zero client may depend on the connection to the cloud 108 or server 106 to provide functionality. A zero client may depend on the cloud 108 or other networks 104 or servers 106 to retrieve operating system data for the client device. The cloud 108 may include back end platforms, e.g., servers 106, storage, server farms, or data centers.

The cloud 108 may be public, private, or hybrid. Public clouds may include public servers 106 that are maintained by third parties to the clients 102 or the owners of the clients. The servers 106 may be located off-site in remote geographical locations as disclosed above or otherwise. Public clouds 108 may be connected to the servers 106 over a public network 104. Private clouds 108 may include private servers 106 that are physically maintained by clients 102 or owners of clients. Private clouds 108 may be connected to the servers 106 over a private network 104. Hybrid clouds 108 may include both the private and public networks 104 and servers 106.

The cloud 108 may also include a cloud based delivery, e.g., Software as a Service (SaaS) 110, Platform as a Service (PaaS) 112, and Infrastructure as a Service (IaaS) 114. IaaS may refer to a user renting the use of infrastructure resources that are needed during a specified time period. IaaS providers may offer storage, networking, servers or virtualization resources from large pools, allowing the users to quickly scale up by accessing more resources as needed. Examples of IaaS include AMAZON WEB SERVICES provided by Amazon.com, Inc., of Seattle, Wash.; RACKSPACE CLOUD provided by Rackspace US, Inc., of San Antonio, Tex.; Google Compute Engine provided by Google Inc. of Mountain View, Calif.; or RIGHTSCALE provided by RightScale, Inc., of Santa Barbara, Calif. PaaS providers may offer functionality provided by IaaS, including, e.g., storage, networking, servers, or virtualization, as well as additional resources such as, e.g., the operating system, middleware, or runtime resources. Examples of PaaS include WINDOWS AZURE provided by Microsoft Corporation of Redmond, Wash.; Google App Engine provided by Google Inc.; and HEROKU provided by Heroku, Inc., of San Francisco, Calif. SaaS providers may offer the resources that PaaS provides, including storage, networking, servers, virtualization, operating system, middleware, or runtime resources. In some embodiments, SaaS providers may offer additional resources, including, e.g., data and application resources. Examples of SaaS include GOOGLE APPS provided by Google Inc.; SALESFORCE provided by Salesforce.com Inc. of San Francisco, Calif.; or OFFICE 365 provided by Microsoft Corporation. Examples of SaaS may also include data storage providers, e.g., DROPBOX provided by Dropbox, Inc., of San Francisco, Calif.; Microsoft SKYDRIVE provided by Microsoft Corporation; Google Drive provided by Google Inc.; or Apple ICLOUD provided by Apple Inc. of Cupertino, Calif.

Clients 102 may access IaaS resources with one or more IaaS standards, including, e.g., Amazon Elastic Compute Cloud (EC2), Open Cloud Computing Interface (OCCI), Cloud Infrastructure Management Interface (CIMI), or OpenStack standards. Some IaaS standards may allow clients access to resources over HTTP and may use Representational State Transfer (REST) protocol or Simple Object Access Protocol (SOAP). Clients 102 may access PaaS resources with different PaaS interfaces. Some PaaS interfaces use HTTP packages, standard Java APIs, JavaMail API, Java Data Objects (JDO), Java Persistence API (JPA), Python APIs, web integration APIs for different programming languages, including, e.g., Rack for Ruby, WSGI for Python, or PSGI for Perl, or other APIs that may be built on REST, HTTP, XML, or other protocols. Clients 102 may access SaaS resources through the use of web-based user interfaces, provided by a web browser (e.g., GOOGLE CHROME, Microsoft INTERNET EXPLORER, or Mozilla Firefox provided by Mozilla Foundation of Mountain View, Calif.). Clients 102 may also access SaaS resources through smartphone or tablet applications, including, e.g., Salesforce Sales Cloud, or Google Drive app. Clients 102 may also access SaaS resources through the client operating system, including, e.g., Windows file system for DROPBOX.

In some embodiments, access to IaaS, PaaS, or SaaS resources may be authenticated. For example, a server or authentication server may authenticate a user via security certificates, HTTPS, or API keys. API keys may include various encryption standards such as, e.g., Advanced Encryption Standard (AES). Data resources may be sent over Transport Layer Security (TLS) or Secure Sockets Layer (SSL).

Figure 1C:
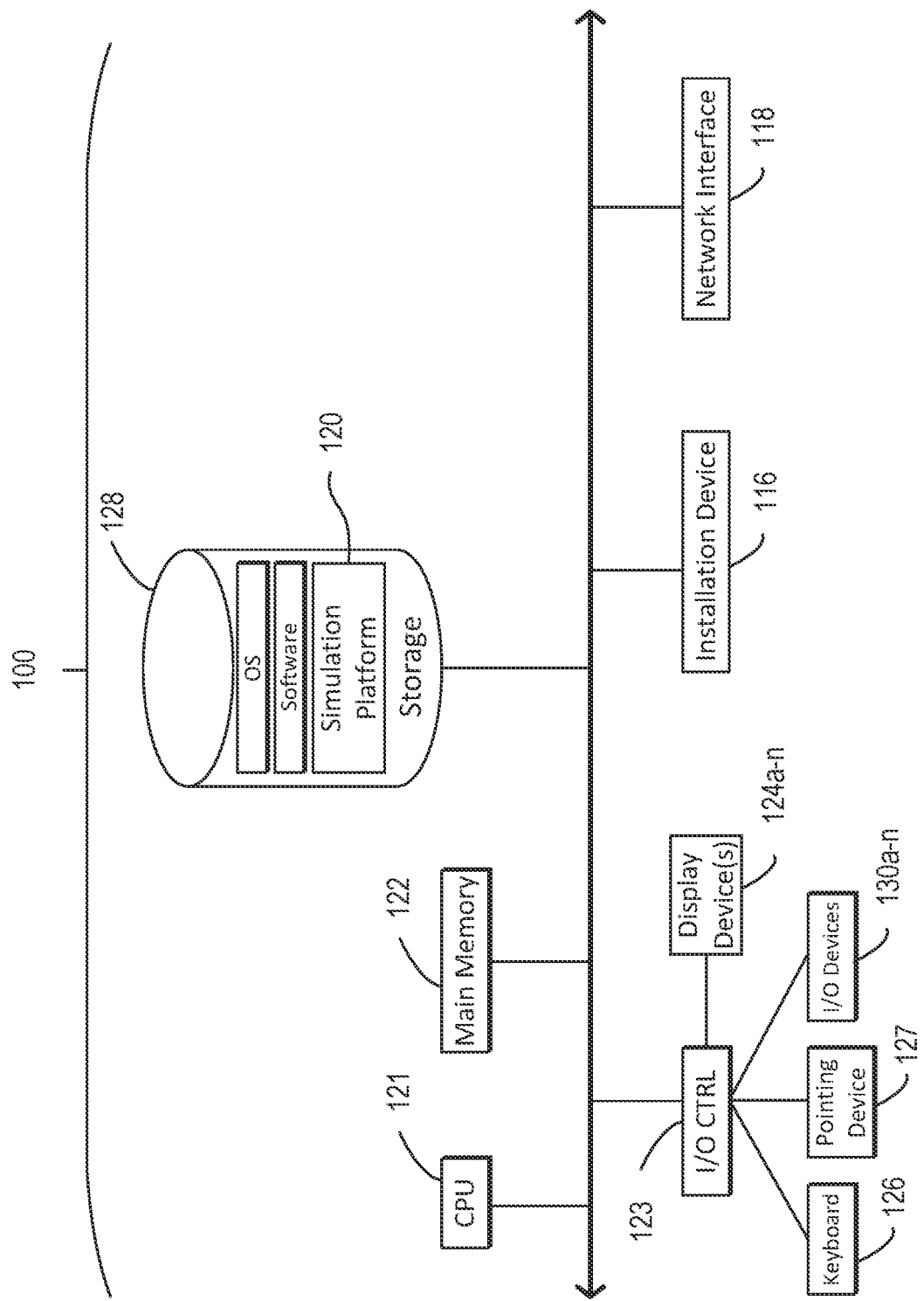
FIGS. 1C and 1D are block diagrams depicting embodiments of computing devices useful in connection with the methods and systems described herein.
Figure 1D:
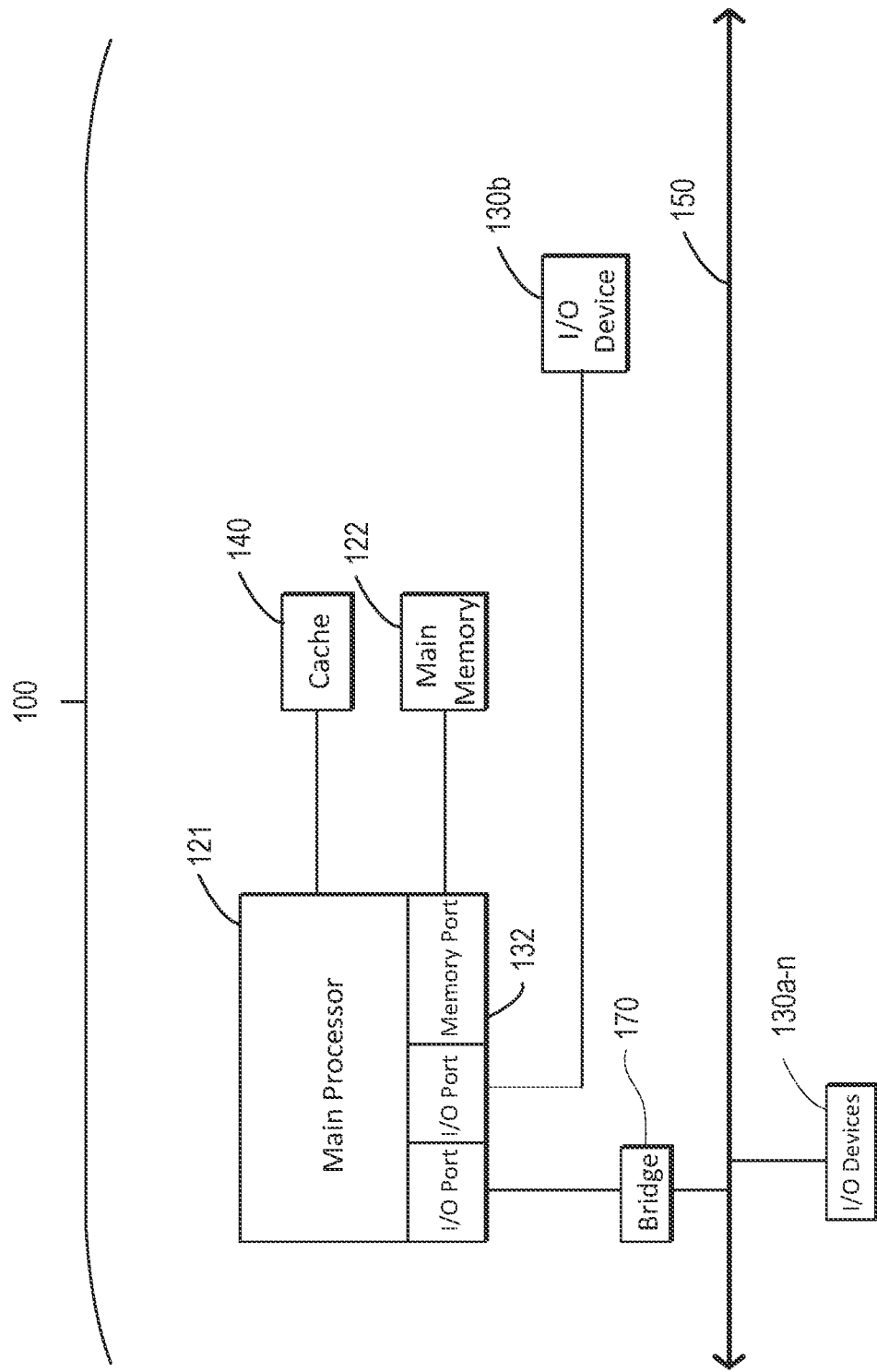

The client 102 and server 106 may be deployed as and/or executed on any type and form of computing device, e.g., a computer, network device or appliance capable of communicating on any type and form of network and performing the operations described herein. FIGS. 1C and 1D depict block diagrams of a computing device 100 useful for practicing an embodiment of the client 102 or a server 106. As shown in FIGS. 1C and 1D, each computing device 100 includes a central processing unit 121 and a main memory unit 122. As shown in FIG. 1C, a computing device 100 may include a storage device 128, an installation device 116, a network interface 118, an I/O controller 123, display devices 124a-124n, a keyboard 126, and a pointing device 127, e.g., a mouse. The storage device 128 may include, without limitation, an operating system, software, and simulation platform 120, which can implement any of the features of the data processing system 205 described herein below in connection with FIG. 2. As shown in FIG. 1D, each computing device 100 may also include additional optional elements, e.g., a memory port 132, a bridge 170, one or more input/output devices 130a-130n (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, e.g., those manufactured by Intel Corporation of Mountain View, Calif.; those manufactured by Motorola Corporation of Schaumburg, Ill.; the ARM processor and TEGRA system on a chip (SoC) manufactured by Nvidia of Santa Clara, Calif.; the POWER7 processor manufactured by International Business Machines of White Plains, N.Y.; or those manufactured by Advanced Micro Devices of Sunnyvale, Calif. The computing device 100 may be based on any of these processors, or any other processor capable of operating as described herein. The central processing unit 121 may utilize instruction level parallelism, thread level parallelism, different levels of cache, and multi-core processors. A multi-core processor may include two or more processing units on a single computing component. Examples of a multi-core processors include the AMD PHENOM IIX2, INTEL CORE i5, INTEL CORE i7, and INTEL CORE i9.

Main memory unit 122 may include one or more memory chips capable of storing data and allowing any storage location to be directly accessed by the microprocessor 121. Main memory unit 122 may be volatile and faster than storage 128 memory. Main memory units 122 may be dynamic random access memory (DRAM) or any variants, including static random access memory (SRAM), Burst SRAM or SynchBurst SRAM (BSRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Single Data Rate Synchronous DRAM (SDR SDRAM), Double Data Rate SDRAM (DDR SDRAM), Direct Rambus DRAM (DRDRAM), or Extreme Data Rate DRAM (XDR DRAM). In some embodiments, the main memory 122 or the storage 128 may be non-volatile; e.g., non-volatile read access memory (NVRAM), flash memory non-volatile static RAM (nvSRAM), Ferroelectric RAM (FeRAM), Magnetoresistive RAM (MRAM), Phase-change memory (PRAM), conductive-bridging RAM (CBRAM), Silicon-Oxide-Nitride-Oxide-Silicon (SONOS), Resistive RAM (RRAM), Racetrack, Nano-RAM (NRAM), or Millipede memory. The main memory 122 may be based on any of the above described memory chips, or any other available memory chips capable of operating as described herein. In the embodiment shown in FIG. 1C, the processor 121 communicates with main memory 122 via a system bus 150 (described in more detail below). FIG. 1D depicts an embodiment of a computing device 100 in which the processor communicates directly with main memory 122 via a memory port 132. For example, in FIG. 1D the main memory 122 may be DRDRAM.

FIG. 1D depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is typically provided by SRAM, BSRAM, or EDRAM. In the embodiment shown in FIG. 1D, the processor 121 communicates with various I/O devices 130 via a local system bus 150. Various buses may be used to connect the central processing unit 121 to any of the I/O devices 130, including a PCI bus, a PCI-X bus, or a PCI-Express bus, or a NuBus. For embodiments in which the I/O device is a video display 124, the processor 121 may use an Advanced Graphics Port (AGP) to communicate with the display 124 or the I/O controller 123 for the display 124. FIG. 1D depicts an embodiment of a computer 100 in which the main processor 121 communicates directly with I/O device 130b or other processors 121' via HYPERTRANSPORT, RAPIDIO, or INFINIBAND communications technology. FIG. 1D also depicts an embodiment in which local busses and direct communication are mixed: the processor 121 communicates with I/O device 130a using a local interconnect bus 150 but communicates with I/O device 130b directly.

A wide variety of I/O devices 130a-130n may be present in the computing device 100. Input devices may include keyboards, mice, trackpads, trackballs, touchpads, touch mice, multi-touch touchpads and touch mice, microphones, multi-array microphones, drawing tablets, cameras, single-lens reflex cameras (SLR), digital SLR (DSLR), CMOS sensors, accelerometers, infrared optical sensors, pressure sensors, magnetometer sensors, angular rate sensors, depth sensors, proximity sensors, ambient light sensors, gyroscopic sensors, or other sensors. Output devices may include video displays, graphical displays, speakers, headphones, inkjet printers, laser printers, and 3D printers.

Devices 130a-130n may include a combination of multiple input or output devices, including, e.g., Microsoft KINECT, Nintendo Wiimote for the WII, Nintendo WII U GAMEPAD, or Apple IPHONE. Some devices 130a-130n allow gesture recognition inputs through combining some of the inputs and outputs. Some devices 130a-130n provide for facial recognition which may be utilized as an input for different purposes including authentication and other commands. Some devices 130a-130n provides for voice recognition and inputs, including, e.g., Microsoft KINECT, SIRI for IPHONE by Apple, Google Now, or Google Voice Search.

Additional devices 130a-130n have both input and output capabilities, including, e.g., haptic feedback devices, touch-screen displays, or multi-touch displays. Touchscreen, multi-touch displays, touchpads, touch mice, or other touch sensing devices may use different technologies to sense touch, including, e.g., capacitive, surface capacitive, projected capacitive touch (PCT), in-cell capacitive, resistive, infrared, waveguide, dispersive signal touch (DST), in-cell optical, surface acoustic wave (SAW), bending wave touch (BWT), or force-based sensing technologies. Some multi-touch devices may allow two or more contact points with the surface, allowing advanced functionality, including, e.g., pinch, spread, rotate, scroll, or other gestures. Some touchscreen devices, including, e.g., Microsoft PIXELSENSE or Multi-Touch Collaboration Wall, may have larger surfaces, such as on a table-top or on a wall, and may also interact with other electronic devices. Some I/O devices 130a-130n, display devices 124a-124n or group of devices may be augmented reality devices. The I/O devices 130a-130n may be controlled by an I/O controller 123 as shown in FIG. 1C. The I/O controller 123 may control one or more I/O devices 130a-130n, such as, e.g., a keyboard 126 and a pointing device 127, e.g., a mouse or optical pen. Furthermore, an I/O device 130 may also provide storage and/or an installation medium 116 for the computing device 100. In still other embodiments, the computing device 100 may provide USB connections (not shown) to receive handheld USB storage devices. In further embodiments, an I/O device 130 may be a bridge between the system bus 150 and an external communication bus, e.g., a USB bus, a SCSI bus, a FireWire bus, an Ethernet bus, a Gigabit Ethernet bus, a Fibre Channel bus, or a Thunderbolt bus.

In some embodiments, display devices 124a-124n may be connected to I/O controller 123. Display devices may include, e.g., liquid crystal displays (LCD), thin film transistor LCD (TFT-LCD), blue phase LCD, electronic papers (e-ink) displays, flexile displays, light emitting diode displays (LED), digital light processing (DLP) displays, liquid crystal on silicon (LCOS) displays, organic light-emitting diode (OLED) displays, active-matrix organic light-emitting diode (AMOLED) displays, liquid crystal laser displays, time-multiplexed optical shutter (TMOS) displays, or 3D displays. Examples of 3D displays may use, e.g., stereoscopy, polarization filters, active shutters, or autostereoscopic. Display devices 124a-124n may also be a head-mounted display (HMD). In some embodiments, display devices 124a-124n or the corresponding I/O controllers 123 may be controlled through or have hardware support for OPENGL or DIRECTX API or other graphics libraries.

In some embodiments, the computing device 100 may include or connect to multiple display devices 124a-124n, which each may be of the same or different type and/or form. As such, any of the I/O devices 130a-130n and/or the I/O controller 123 may include any type and/or form of suitable hardware, software, or combination of hardware and software to support, enable or provide for the connection and use of multiple display devices 124a-124n by the computing device 100. For example, the computing device 100 may include any type and/or form of video adapter, video card, driver, and/or library to interface, communicate, connect, or otherwise use the display devices 124a-124n. In one embodiment, a video adapter may include multiple connectors to interface to multiple display devices 124a-124n. In other embodiments, the computing device 100 may include multiple video adapters, with each video adapter connected to one or more of the display devices 124a-124n. In some embodiments, any portion of the operating system of the computing device 100 may be configured for using multiple displays 124a-124n. In other embodiments, one or more of the display devices 124a-124n may be provided by one or more other computing devices 100a or 100b connected to the computing device 100 via the network 104. In some embodiments, software may be designed and constructed to use another computer's display device as a second display device 124a for the computing device 100. For example, in one embodiment, an Apple iPad may connect to a computing device 100 and use the display of the device 100 as an additional display screen that may be used as an extended desktop. One ordinarily skilled in the art will recognize and appreciate the various ways and embodiments that a computing device 100 may be configured to have multiple display devices 124a-124n.

Referring again to FIG. 1C, the computing device 100 may comprise a storage device 128 (e.g., one or more hard disk drives or redundant arrays of independent disks) for storing an operating system or other related software, and for storing application software programs such as any program related to the simulation platform 120. Examples of storage device 128 include, e.g., hard disk drive (HDD); optical drive including CD drive, DVD drive, or BLU-RAY drive; solid-state drive (SSD); USB flash drive; or any other device suitable for storing data. Some storage devices may include multiple volatile and non-volatile memories, including, e.g., solid state hybrid drives that combine hard disks with solid state cache. Some storage device 128 may be non-volatile, mutable, or read-only. Some storage device 128 may be internal and connect to the computing device 100 via a bus 150. Some storage device 128 may be external and connect to the computing device 100 via an I/O device 130 that provides an external bus. Some storage device 128 may connect to the computing device 100 via the network interface 118 over a network 104, including, e.g., the Remote Disk for MACBOOK AIR by Apple. Some client devices 100 may not require a non-volatile storage device 128 and may be thin clients or zero clients 102. Some storage device 128 may also be used as an installation device 116, and may be suitable for installing software and programs. Additionally, the operating system and the software 110 can be run from a bootable medium, for example, a bootable CD, e.g., KNOPPIX, a bootable CD for GNU/Linux that is available as a GNU/Linux distribution from knoppix.net.

Client device 100 may also install software 110 or application from an application distribution platform 112. Examples of application distribution platforms 112 include the App Store for iOS provided by Apple, Inc.; the Mac App Store provided by Apple, Inc.; GOOGLE PLAY for Android OS provided by Google Inc.; Chrome Webstore for CHROME OS provided by Google Inc.; and Amazon Appstore for Android OS and KINDLE FIRE provided by Amazon.com, Inc. An application distribution platform 112 may facilitate installation of software 110 on a client device 102. An application distribution platform 112 may include a repository of applications on a server 106 or a cloud 108, which the clients 102a-102n may access over a network 104. An application distribution platform 112 may include an application developed and provided by various developers. A user of a client device 102 may select, purchase, and/or download an application via the application distribution platform 112.

Furthermore, the computing device 100 may include a network interface 118 to interface to the network 104 through a variety of connections, including, but not limited to, standard telephone lines, LAN or WAN links (e.g., 802.11, T1, T3, Gigabit Ethernet, Infiniband), broadband connections (e.g., ISDN, Frame Relay, ATM, Gigabit Ethernet, Ethernet-over-SONET, ADSL, VDSL, BPON, GPON, fiber optical including FiOS), wireless connections, or some combination of any or all of the above. Connections can be established using a variety of communication protocols (e.g., TCP/IP, Ethernet, ARCNET, SONET, SDH, Fiber Distributed Data Interface (FDDI), IEEE 802.11a/b/g/n/ac CDMA, GSM, WiMax and direct asynchronous connections). In one embodiment, the computing device 100 communicates with other computing devices 100' via any type and/or form of gateway or tunneling protocol, e.g., Secure Socket Layer (SSL) or Transport Layer Security (TLS), or the Citrix Gateway Protocol manufactured by Citrix Systems, Inc., of Ft. Lauderdale, Fla. The network interface 118 may comprise a built-in network adapter, network interface card, PCMCIA network card, EXPRESSCARD network card, card bus network adapter, wireless network adapter, USB network adapter, modem, or any other device suitable for interfacing between the computing device 100 and any type of network capable of communication and performing the operations described herein.

A computing device 100 of the sort depicted in FIGS. 1B and 1C may operate under the control of an operating system, which controls scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to, WINDOWS 2000, WINDOWS Server 2012, WINDOWS CE, WINDOWS Phone, WINDOWS XP, WINDOWS VISTA, and WINDOWS 7, WINDOWS RT, and WINDOWS 8 all of which are manufactured by Microsoft Corporation of Redmond, Wash.; MAC OS and iOS, manufactured by Apple, Inc., of Cupertino, Calif.; and Linux, a freely-available operating system, e.g., Linux Mint distribution ("distro") or Ubuntu, distributed by Canonical Ltd. of London, United Kingdom; or Unix or other Unix-like derivative operating systems; and Android, designed by Google, of Mountain View, Calif., among others. Some operating systems, including, e.g., the CHROME OS by Google, may be used on zero clients or thin clients, including, e.g., CHROMEBOOKS.

The computer system 100 can be any workstation, telephone, desktop computer, laptop or notebook computer, netbook, ULTRABOOK, tablet, server, handheld computer, mobile telephone, smartphone or other portable telecommunications device, media playing device, a gaming system, mobile computing device, or any other type and/or form of computing, telecommunications or media device that is capable of communication. The computer system 100 has sufficient processor power and memory capacity to perform the operations described herein. In some embodiments, the computing device 100 may have different processors, operating systems, and input devices consistent with the device. The Samsung GALAXY smartphones, e.g., operate under the control of Android operating system developed by Google, Inc. GALAXY smartphones receive input via a touch interface.

In some embodiments, the computing device 100 is a gaming system. For example, the computer system 100 may comprise a PLAYSTATION 3, a PLAYSTATION 4, PLAYSTATION 5, or PERSONAL PLAYSTATION PORTABLE (PSP), or a PLAYSTATION VITA device manufactured by the Sony Corporation of Tokyo, Japan, a NINTENDO DS, NINTENDO 3DS, NINTENDO WII, NINTENDO WII U, or a NINTENDO SWITCH device manufactured by Nintendo Co., Ltd., of Kyoto, Japan, an XBOX 360, an XBOX ONE, an XBOX ONE S, an XBOX ONE X, an XBOX SERIES S, or an XBOX SERIES X, manufactured by the Microsoft Corporation of Redmond, Wash.

In some embodiments, the computing device 100 is a digital audio player such as the Apple IPOD, IPOD Touch, and IPOD NANO lines of devices, manufactured by Apple Computer of Cupertino, Calif. Some digital audio players may have other functionality, including, e.g., a gaming system or any functionality made available by an application from a digital application distribution platform. For example, the IPOD Touch may access the Apple App Store. In some embodiments, the computing device 100 is a portable media player or digital audio player supporting file formats, including, but not limited to, MP3, WAV, M4A/AAC, WMA Protected AAC, AIFF, Audible audiobook, Apple Lossless audio file formats and .mov, .m4v, and .mp4 MPEG-4 (H.264/MPEG-4 AVC) video file formats.

In some embodiments, the computing device 100 is a tablet, e.g., the IPAD line of devices by Apple; GALAXY TAB family of devices by Samsung; or KINDLE FIRE, by Amazon.com, Inc., of Seattle, Wash. In other embodiments, the computing device 100 is an eBook reader, e.g., the KINDLE family of devices by Amazon.com, or NOOK family of devices by Barnes & Noble, Inc., of New York City, N.Y.

In some embodiments, the communications device 102 includes a combination of devices, e.g., a smartphone combined with a digital audio player or portable media player. For example, one of these embodiments is a smartphone, e.g., the IPHONE family of smartphones manufactured by Apple, Inc.; a Samsung GALAXY family of smartphones manufactured by Samsung, Inc.; or a Motorola DROID family of smartphones. In yet another embodiment, the communications device 102 is a laptop or desktop computer equipped with a web browser and a microphone and speaker system, e.g., a telephony headset. In these embodiments, the communications devices 102 are web-enabled and can receive and initiate phone calls. In some embodiments, a laptop or desktop computer is also equipped with a webcam or other video capture device that enables video chat and video call.

In some embodiments, the status of one or more machines 102, 106 in the network 104 are monitored, generally as part of network management. In one of these embodiments, the status of a machine may include an identification of load information (e.g., the number of processes on the machine, CPU and memory utilization), of port information (e.g., the number of available communication ports and the port addresses), or of session status (e.g., the duration and type of processes, and whether a process is active or idle). In another of these embodiments, this information may be identified by a plurality of metrics, and the plurality of metrics can be applied at least in part towards decisions in load distribution, network traffic management, and network failure recovery as well as any aspects of operations of the present solution described herein. Aspects of the operating environments and components described above will become apparent in the context of the systems and methods disclosed herein.

B. Modeling Live Events

The systems and methods of this technical solution provide techniques for modeling live events using results produced from simulations of the live events. Existing technical solutions that utilize computers to model live events implement brute-force approaches to calculate probabilities of combinations of outcomes that may occur during the live events. The brute-force approaches include individually and iteratively processing and computing the probability of each combination of all possible outcomes that may occur during the live event. Calculating the probability of combinations of events typically exhausts computational resources, and therefore using such brute-force methods each time a request is received is computationally intensive and becomes impracticable to perform as the number of conditional events or the number of requests increases. To address these and other issues, the systems and methods can execute simulations of live events in an offline (e.g., non-real-time) process to generate data structures that include one or more outcomes of different actions (e.g., points scored, other actions described herein, etc.) that may occur during the live events. Rather than brute-force computing the probability of the combination of events each time a request is received, the simulation results can then be filtered in real-time or near real-time to estimate probabilities of requested combinations of actions or occurrences during the live event. This provides a significant improvement in computational performance and significantly reduces the computational resources required to process requests from large numbers of client devices. These and other improvements are described in further detail herein.

Figure 2:
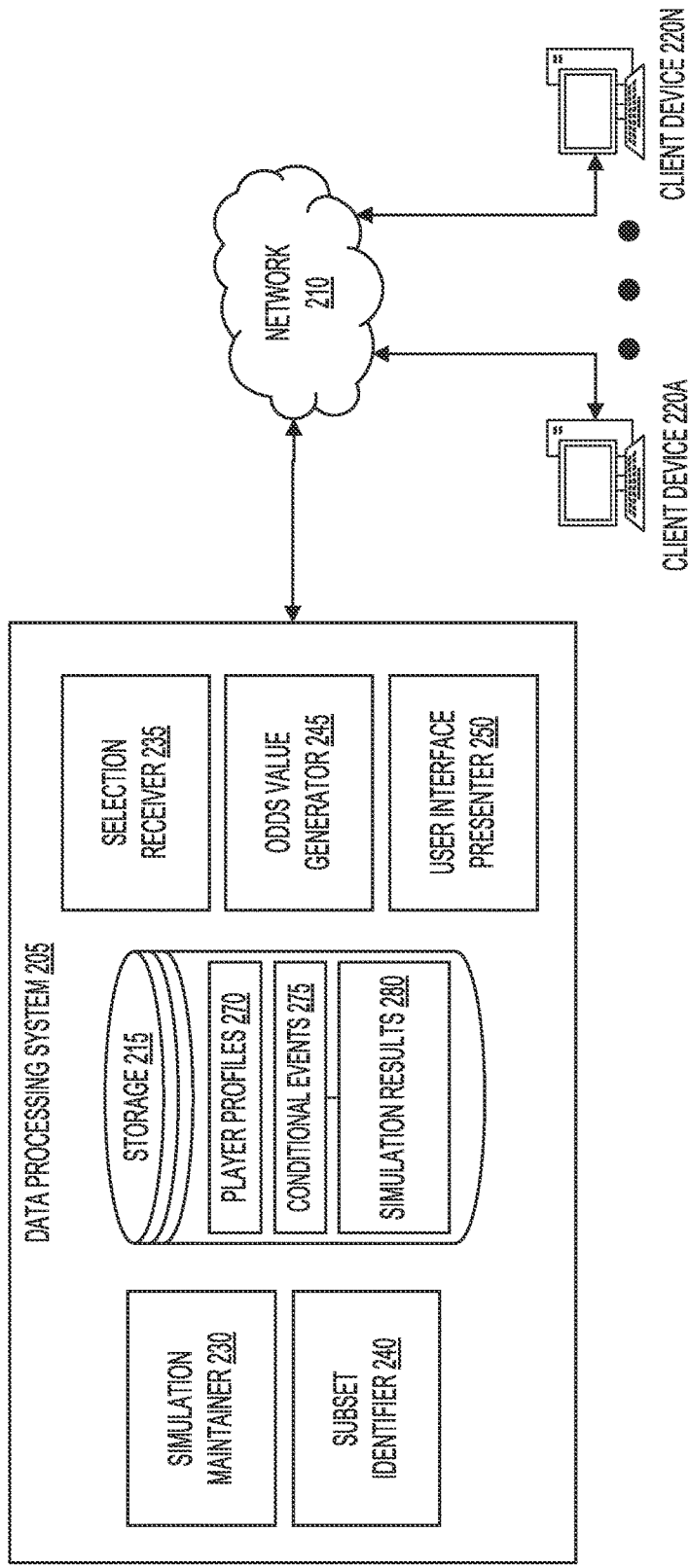
FIG. 2 is a block diagram of an example system for modeling live events, in accordance with one or more implementations.

Referring now to FIG. 2, illustrated is a block diagram of an example system 200 for modeling live events, in accordance with one or more implementations. The system 200 can include at least one data processing system 205, at least one network 210, and one or more client devices 220A-220N (sometimes generally referred to as client device(s) 220). The data processing system 205 can include a simulation maintainer 230, a selection receiver 235, a subset identifier 240, an odds value generator 245, a user interface presenter 250, and at least one database 215. The storage 215 can include one or more player profiles 270, one or more conditional events 275 (individual conditional events of which are sometimes referred to as a "conditional event 275"), and one or more simulation results 280 (individual results of which are sometimes referred as a "simulation result 280"). Although shown here as internal to the data processing system 205, the storage 215 can be external to the data processing system 205, for example, as a part of a cloud computing system or an external computing device in communication with the devices (e.g., the data processing system 205, the client devices 220, etc.) of the system 200 via the network 210.

Each of the components (e.g., the data processing system 205, the network 210, the client devices 220, the simulation maintainer 230, the selection receiver 235, the subset identifier 240, the odds value generator 245, the user interface presenter 250, the storage 215, etc.) of the system 200 can be implemented using the hardware components or a combination of software with the hardware components of a computing system, such as the computing system 100 detailed herein in conjunction with FIGS. 1A-1D, or any other computing system described herein. Each of the components of the data processing system 205 can perform the functionalities detailed herein.

The data processing system 205 can include at least one processor and a memory (e.g., a processing circuit). The memory can store processor-executable instructions that, when executed by a processor, cause the processor to perform one or more of the operations described herein. The processor may include a microprocessor, an application-specific integrated circuit (ASIC), a field-programmable gate array (FPGA), a graphics processing unit (GPU), a tensor processing unit (TPU), etc., or combinations thereof. The memory may include, but is not limited to, electronic, optical, magnetic, or any other storage or transmission device capable of providing the processor with program instructions. The memory may further include a floppy disk, CD-ROM, DVD, magnetic disk, memory chip, ASIC, FPGA, read-only memory (ROM), random-access memory (RAM), electrically erasable programmable ROM (EEPROM), erasable programmable ROM (EPROM), flash memory, optical media, or any other suitable memory from which the processor can read instructions. The instructions may include code from any suitable computer programming language. The data processing system 205 can include one or more computing devices or servers that can perform various functions as described herein. The data processing system 205 can include any or all of the components and perform any or all of the functions of the computer system 100 described herein in conjunction with FIGS. 1A-1D.

In some implementations, the data processing system 205 may communicate with the client devices 220, for example, to provide user interfaces (e.g., the user interfaces described in connection with FIGS. 3A-3H, etc.) and to receive user input, via the network 210. In one example, the data processing system 205 can be or can include an application server or webserver, which may include software modules allowing various computing devices (e.g., the client devices 220, etc.) to access or manipulate data stored by the data processing system 205. For example, the data processing system 205 may include a webserver allowing the client devices 220 to access data (e.g., via one or more web-based user interfaces, such as those described in connection with FIGS. 3A-3H) that is collected and manipulated by the data processing system 205. For example, a player accessing the functionality of the data processing system 205 using a corresponding player profile 270 may execute a web browser application and access a website hosted on the webserver in order to access data (e.g., one or more interfaces to select combinations of conditional events 275 for one or more live events as described herein, etc.).

The network 210 can include computer networks such as the Internet, local, wide, metro or other area networks, intranets, satellite networks, other computer networks such as voice or data mobile phone communication networks, or combinations thereof. The data processing system 205 of the system 200 can communicate via the network 210 with one or more computing devices, such as the one or more client devices 220. The network 210 may be any form of computer network that can relay information between the data processing system 205, the one or more client devices 220, and one or more information sources, such as web servers or external databases, amongst others. In some implementations, the network 210 may include the Internet and/or other types of data networks, such as a local area network (LAN), a wide area network (WAN), a cellular network, a satellite network, or other types of data networks. The network 210 may also include any number of computing devices (e.g., computers, servers, routers, network switches, etc.) that are configured to receive or transmit data within the network 210.

The network 210 may further include any number of hardwired or wireless connections. Any or all of the computing devices described herein (e.g., the data processing system 205, the one or more client devices 220, the computer system 100, etc.) may communicate wirelessly (e.g., via Wi-Fi, cellular communication, radio, etc.) with a transceiver that is hardwired (e.g., via a fiber optic cable, a CAT5 cable, etc.) to other computing devices in the network 210. Any or all of the computing devices described herein (e.g., the data processing system 205, the one or more client devices 220, the computer system 100, etc.) may also communicate wirelessly with the computing devices of the network 210 via a proxy device (e.g., a router, network switch, or gateway). In some implementations, the network 210 can be similar to or can include the network 104 or the cloud 108 described herein above in conjunction with FIGS. 1A and 1B.

Each of the client devices 220 can include at least one processor and a memory (e.g., a processing circuit). The memory can store processor-executable instructions that, when executed by the processor, cause the processor to perform one or more of the operations described herein. The processor can include a microprocessor, an ASIC, an FPGA, a GPU, a TPU, etc., or combinations thereof. The memory can include, but is not limited to, electronic, optical, magnetic, or any other storage or transmission device capable of providing the processor with program instructions. The memory can further include a floppy disk, CD-ROM, DVD, magnetic disk, memory chip, ASIC, FPGA, ROM, RAM, EEPROM, EPROM, flash memory, optical media, or any other suitable memory from which the processor can read instructions. The instructions can include code from any suitable computer programming language. The client devices 220 can include one or more computing devices or servers that can perform various operations as described herein. The one or more client devices 220 can include any or all of the components and perform any or all of the functions of the computer system 100 described herein in conjunction with FIGS. 1A-1D. The client devices 220 can be, or can be similar to, the client devices 102 described herein above in connection with FIGS. 1A-1D.

Each client device 220 can be a personal computer, a laptop computer, a television device, a smart phone device, a mobile device, or another type of computing device. Each client device 220 can be implemented using hardware or a combination of software and hardware. Each client device 220 can include a display or display portion. The display can include a display portion of a television, a display portion of a computing device, a GUI, or another type of interactive display (e.g., a touchscreen, a display, etc.) and one or more I/O devices (e.g., a mouse, a keyboard, digital key pad). The display can present one or more user interfaces described in connection with FIGS. 3A-3H, which relate to the selection of one or more combinations of conditional events 275, as described herein. The display can include a touch screen displaying an application, such as a web browser application or a native application, which may be used to access the functionality of the data processing system 205, as described herein.

The display may include a border region (e.g., side border, top border, bottom border). The display can include a touch screen display, which can receive interactions from a player. The client device 220 may also receive interactions via any other type of I/O device. The interactions can result in interaction data, which can be stored and transmitted by the processing circuitry of the client device 220. The interaction data can include, for example, interaction coordinates, an interaction type (e.g., drag, click, swipe, scroll, tap, etc.), and an indication of an actionable object (e.g., an interactive user interface element, such as a button, hyperlink, etc.) with which the interaction occurred. The interaction data can identify a user interface element (e.g., including any of the user interface elements described in connection with FIGS. 3A-3H) with which the interaction occurred.

Each client device 220 can include an input device that couples or communicates with the display of each client device 220 to enable a player to interact with or select one or more actionable objects as described herein. The display can enable interaction with one or more visual indications provided through the display of each client device 220, and responsive to an interaction (e.g., select, click-on, touch, hover), the client device 220 can generate an indication identifying a user input or selection of a wager, a live event, one or more selections of combinations of conditional events 275, an indication to place a wager, or an interaction to request odds values for a selected combination of conditional events 275, among others.

Each client device 220 can include or be identified by a device identifier, which can be specific to each respective client device 220. The device identifier can include a script, code, label, or marker that identifies a particular client device 220. In some implementations, the device identifier can include a string or plurality of numbers, letters, characters, or any combination numbers, letters, and characters. In some embodiments, each client device 220 can have a unique device identifier. Each client device 220 can include a client application, which can be a web browser or a native application that communicates with the data processing system 205 to present user interfaces (e.g., the user interfaces 300A-300H of FIGS. 3A-3H), generate one or more data records corresponding to a live event (e.g., a post, a wager, etc.), or other functionality described herein. The client application can be executing on each client device 220, and may be provided to the client device 220 by the data processing system 205. The application can include a web application, a server application, a resource, a desktop, or a file.

The application can include a local application (e.g., local to a client device 220), hosted application, a SaaS application, a virtual application, a mobile application, or other forms of content. In some implementations, the application can include or correspond to applications provided by remote servers or third-party servers. In some implementations, the application can access the player profiles 270 or the conditional events 275 stored and maintained in the storage 215, and generate one or more interactive user interface elements, such as the interactive user interface elements described in connection with FIGS. 3A-3H, to a player when executed by a client device 220. Some example interactive user interface elements include user-selectable hyperlinks, buttons, graphics, videos, images, or other application features. Interactions with such interactive user interface elements (sometimes referred to as "actionable objects") can cause the application executing on the respective client device 220 to generate a signal, which can cause the application to perform further operations corresponding to the actionable object.

In some implementations, one or more client devices 220 can establish one or more communication sessions with the data processing system 205. A communication session can include a channel or connection between the data processing system 205 and a respective client device 220. The one or more communication sessions can each include an application session (e.g., virtual application), an execution session, a desktop session, a hosted desktop session, a terminal services session, a browser session, a remote desktop session, a URL session or a remote application session. Each communication session can include encrypted or secure sessions, which can include an encrypted file, encrypted data, or traffic.

In some implementations, in response to interactions with corresponding user interface elements, the application executing on a client device 220 can transmit information, such as player profile 270 information (e.g., changing player profile 270 parameters, changing login information, etc.), interaction information, selections of wager amounts, selections to request odds for combinations of conditional events 275 of live events (e.g., live sporting events, etc.), or selections to request conditional events 275 for current or upcoming live events, selections to request players, plays, or other attributes or potential actions that may occur during an identified live event, among other selections described herein. For example, the client device 220 can transmit a request for one or more participants of a live event (e.g., athletes playing for a particular team during a live event, etc.). Additional requests may also be transmitted, including requests to place one or more wagers, execute one or more simulations to generate the simulation results 280, or requests for information (e.g., available wagers, odds information, etc.) related to one or more live events, among others. The requests can be hypertext transfer protocol (HTTP or HTTPS) request messages, file transfer protocol messages, email messages, text messages, or any other type of message that can be transmitted via the network 210.

As described herein, a client device 220 can receive one or more interactions with actionable objects presented on the display of the client device. Interactions can be tap interactions, click interactions, or other types of indications that a user is engaged with a particular user interface element. Upon detecting an interaction with a particular user interface element, the client device 220 can execute instructions (e.g., processor-readable code, a script, etc.) that cause the client device 220 to transmit an appropriate signal to the data processing system 205. Additionally, the client devices 220 may receive and display one or more content items or interactive user interface elements that may correspond to one or more conditional events 275, one or more live events, one or more odds values, or one or more live event participants, as described herein.

In some implementations, the application interfaces can present a selectable list of live events (e.g., current or upcoming sporting events, etc.). Upon selection of a live event in the list, or upon a receiving a request to perform a parlay wager, the data processing system 205 can provide one or more user interfaces similar to the user interfaces shown in FIGS. 3A-3H, which enable a user to select one or more combinations of conditional events 275, as described herein, to assemble parlay wagers. Upon receiving one or more selections of the conditional events 275, the data processing system 205 can perform the various operations described herein to generate odds values in real-time or near real-time, which may be presented on the application interfaces presented at the respective client device.

The storage 215 can be a computer-readable memory that can store or maintain any of the information described herein. The storage 215 can store or maintain one or more data structures, which may contain, index, or otherwise store each of the values, pluralities, sets, variables, vectors, numbers, or thresholds described herein. The storage 215 can be accessed using one or more memory addresses, index values, or identifiers of any item, structure, or region maintained in the storage 215. The storage 215 can be accessed by the components of the data processing system 205, or any other computing device described herein, via the network 210. In some implementations, the storage 215 can be internal to the data processing system 205. In some implementations, the storage 215 can exist external to the data processing system 205, and may be accessed via the network 210. The storage 215 can be distributed across many different computer systems or storage elements, and may be accessed via the network 210 or a suitable computer bus interface. The data processing system 205 can store, in one or more regions of the memory of the data processing system 205, or in the storage 215, the results of any or all computations, determinations, selections, identifications, generations, constructions, or calculations in one or more data structures indexed or identified with appropriate values.

Any or all values stored in the storage 215 may be accessed by any computing device described herein, such as the data processing system 205, to perform any of the functionalities or functions described herein. In some implementations, a computing device, such as a client device 220, may utilize authentication information (e.g., username, password, email, etc.) to show that the client device 220 is authorized to access requested information in the storage 215. The storage 215 may include permission settings that indicate which users, devices, or profiles are authorized to access certain information stored in the storage 215. The storage 215 may be similar to or include the storage 128 described herein above in conjunction with FIG. 1C. In some implementations, instead of being internal to the data processing system 205, the storage 215 can form a part of a cloud computing system. In such implementations, the storage 215 can be a distributed storage medium in a cloud computing system and can be accessed by any of the components of the data processing system 205, by the one or more client devices 220 (e.g., via one or more user interfaces, etc.), or any other computing devices described herein.

The storage 215 can store one or more player profiles 270 in one or more data structures. Each player profile 270 can be associated with a corresponding player (e.g., a user) of a client device 220 that accesses the functionality of the data processing system 205. In implementations where the data processing system 205 can operate without using a client device 220 (e.g., a slot machine, a video game machine, a standalone wagering kiosk, etc.), a player profile 270 may correspond to a player that accesses the data processing system 205 to place wagers. Each player profile 270 can be a user profile that includes information about a user. Each player profile 270 may include information about one or more of the client devices 220 used to access the data processing system 205 using the player profile 270. For example, identifiers of a player profile 270 can be used to access the functionality of the data processing system 205 via the network 210.

The identifiers of player profiles 270 can include a username, a password, an e-mail address, a phone number, a personal identification number (PIN), a secret code-word, or device identifiers for use in a two-factor authentication technique, among others. The player profile 270 can store information about historic wagers (e.g., including parlay wagers), historic selections of conditional events 275, historic games viewed or wagered upon using the player profile 270, and historic live event outcomes, or other information. The player profile 270 can store a credit balance or wager information (e.g., an amount of a wager, a timestamp associated with a wager, information about the presence of an indication to participate in a bonus opportunity using the wager, a client device identifier of a client device that was used to place the wager, wager types, parlay wager complexity such as the number of conditional events 275 in each parlay wager placed using the player profile 270, etc.).

The player profile 270 can store information about a client device 220 used to access the data processing system 205 such as an internet protocol (IP) address, a media access control (MAC) address, a global unique identification (GUID), a player profile 270 name (e.g., the name of a user of the client device 220, a player-chosen username, etc.), device name, among others. In some implementations, a player profile 270 can be created by the data processing system 205 in response to a player profile 270, creation request transmitted by a client device 220. The player profile 270 creation request can include any of the player profile 270 information described herein. In some implementations, a client device 220 accessing the data processing system 205 may not be associated with a player profile 270. In such implementations, the data processing system 205 can automatically create a player profile 270 using an identifier of the client device 220 provided by the client device 220.

The storage 215 can store or maintain one or more conditional events 275 associated with one or more simulation results 275 for one or more live events (e.g., current or upcoming sporting events). The conditional events 275 can be stored in one or more data structures. The conditional events 275 can correspond to any action or event that may occur in a live game (e.g., a live event) that may be mutually exclusive (e.g., have one outcome). Once example of a conditional event 275 is "who will score the first touchdown in an upcoming football game" (e.g., there can be only one first touchdown scorer). Each conditional event 275 may be generated or predetermined and stored in the storage 215 such that they are accessible by the components of the data processing system 205. In an embodiment, one or more conditional events 275 may be generated based upon one or more conditional event templates for a live event type (e.g., a type of sporting event, etc.). Prior to an upcoming live event, the data processing system 205 (or any components thereof) may generate one or more conditional events 275 for the upcoming live event by applying one or more templates to the attributes of the upcoming live event (e.g., which athletes are participating in the live event, which teams are playing in the live event, possible outcomes of the live event, etc.). Respective sets of conditional events 275 can be stored in the storage for each live event. Each set of conditional events 275 can correspond to potential outcomes that may occur during the live event. Some example conditional events 275 that may correspond to an example football game include which athlete will score the first touchdown, which athlete will score the second touchdown, which team will win the game, or which team will have a greater score at halftime, among others. It should be understood that other conditional events are also possible for other types of live events (e.g., baseball games, hockey games, basketball games, other types of live events, etc.). A conditional event 275 can be any type of event or potential, mutually exclusive outcome on which a wager can be placed.

The data processing system 205 can store one or more data records in the storage 215, for example, in one or more data structures. As described herein, the client device 220 can transmit interaction data to the data processing system 205 in response to placing a wager via one or more application interfaces (e.g., a parlay wager using the selections described in connection with FIGS. 3A-3H). The wager information in the interaction data can include, for example, any input information as part of the wager (e.g., wager amounts, selections of outcomes for one or more conditional events 275, etc.), the player profile 270 associated with the client device 220, a wager type (e.g., parlay wager, etc.), an identifier of a live event corresponding to the wager, a wager identifier, or any other information relating to the wager. Upon receiving the interaction data, the data processing system 205 can store the interaction data as a data record, in association with the player profile 270 that was used to provide the interaction data. The data records can be records of wagers, requests to modify a player profile 270, or any other data relating to live events that may be provided via an interaction at a client device 220. In some implementations, the data processing system 205 can store the data record in association with one or more identifiers of a live event or a wagering opportunity of the live event identified in the interaction received from the client device 220.

The storage 215 can store or maintain one or more simulation results 280 associated with one or more corresponding conditional events 275, for example, in one or more data structures. The simulation results 280 can be generated from simulations of one or more live events (e.g., sports game simulations), which may be executed by the data processing system 205 or by another external computing system (not pictured). Each live event can be associated with multiple sets of simulation results 280, with each set of simulation results 280 including respective outcomes for each conditional event 275 that may occur during the live event. Each set of simulation results 280 can be generated by a respective simulation of the live event.

Each simulation used to generate the simulation results 280 may depend partially on an element of randomness, and may be based on various aspects of the particular live event, the teams and athletes participating in the live event, and any other attribute or characteristic that may influence any outcome that may occur during the live event. As such, each set of simulation results 280 generated from each simulation may include different outcomes for the conditional events 275 of the simulated live event. An example data structure representation of the simulation results 280 of conditional events 275 of a live event is shown below in Table 1.

TABLE 1

| | Simulation Number | | | | | | | | | |
|---|---|---|---|---|---|---|---|---|---|---|
| | 1 | 2 | 3 | 4 | 5 | 6 | 7 | 8 | 9 | 10 |
| Conditional Event #1 | A | B | C | D | A | B | C | D | A | C |
| Conditional Event #2 | B | B | A | B | A | C | D | A | C | A |

As shown in Table 1 above, the simulation results 280 for a live event may be organized according to various conditional events 275 that may occur during the live event. In Table 1, each simulation 1, 2, 3 . . . corresponds to a respective simulation of the live event, and the values A, B, C, and D correspond to simulated outcomes of the respective conditional event 275 for that row of the table. The components of the data processing system 205 can utilize the simulation results 280 to calculate odds values for parlay wagers involving multiple conditional events 275. Although only ten simulation results are shown in Table 1, it should be understood that hundreds, thousands, tens of thousands, hundreds of thousands, or millions of simulations may be executed for a live event, with corresponding outcomes for each conditional event 275 that occur in each simulation being recorded as part of the simulation results 280. Likewise, the example A, B, C, and D outcomes are provided purely for example purposes. It should be understood that any number of potential outcomes can occur for a conditional event 275, and that different conditional events 275 may have different numbers of potential outcomes.

Referring now to the operations of the data processing system 205, the simulation maintainer 230 can maintain the simulation results 280 corresponding to outcomes of the conditional events 275 that can occur during the simulations to which the simulation results 280 correspond, as described herein. For example, the simulation maintainer 230 can maintain one or more data structures that include the simulation results 280, which may be stored in association with respective identifiers of respective conditional events, as described herein. In some implementations, the simulation results 280 for a particular conditional event 275 can include respective counter values that correspond to a count of each outcome for each simulation of the corresponding live event. The simulation maintainer 230 can calculate or generate the counter values for each conditional event 275 of a live event by scanning through the simulation results 280 of the simulations of the live event, or may receive (or retrieve, from the storage 215) the counter values as part of the simulation results 280 from an external computing system that executed the simulations of the live event.

In some implementations, the simulation maintainer 230 can itself generate the simulation results 280 for a live event by executing simulations of the live event. A simulation of a live event can be a model of the event and can produce one or more outputs that correspond to various outcomes of the live event. For example, if the live event is a sporting event, the outcomes may include timestamps of simulated game events (e.g., points scored, passes made, etc.), along with identifiers of participants (e.g., athletes) that performed the simulated game event. Executing the simulations can include executing processor-readable instructions that cause the simulation maintainer 230 to carry out a model of the live event, with the outputs of the simulation being respective simulation results 280 for each conditional event 275 of the live event, as described herein. Each simulation used to generate the simulation results 280 may depend partially on an element of randomness (e.g., one or more random numbers generated using one or more random number generators), and may be based on various aspects of the particular live event, such as the teams and athletes participating in the live event or any other attribute or characteristic that may influence any outcome that may occur during the live event. As such, the simulation results 280 generated from each simulation may include different outcomes for the conditional events 275 of the simulated live event.

The simulation maintainer 230 can execute a predetermined number of simulations of the live event, for example. The predetermined number may be specified in one or more requests from an external computing device (e.g., a client device 220, an administrative computing system, an operator of the data processing system 205, etc.). In some implementations, one or more of the simulations of the live event can be executed by an external computing system (not pictured), which can store corresponding simulation results 280 in the storage 215, as described herein. The simulation maintainer 230 can generate counter values for each outcome of each conditional event 275 of the live event to which the simulations correspond. To do so, the simulation maintainer can update a respective counter value for each conditional event 275 based on the various outcomes indicated in the simulation results 280 for the live event. The simulations of the live event can be executed as an offline process (e.g., prior to the live event, not in real-time or near real-time, etc.). The simulation results 280 can be maintained to perform the estimation of odds values for parlay wagers or other combinations of candidate outcomes of conditional events 275, as described herein.

The selection receiver 235 can receive one or more selections identifying respective selected outcomes for one or more conditional events 275 to occur during a live event. The selections can be received, for example, via a user interface (e.g., user interfaces provided by the data processing system 205 similar to those described in connection with FIGS. 3A-3H, etc.) presented at a client device 220. As described herein, particular wagers, such as parlay wagers, can include wagers on multiple mutually exclusive conditional events. The odds values for such wagers can be calculated across two correlated markets, containing a number of mutually exclusive outcomes of conditional events 275. The client device 220 can access a webpage or application resource provided by the data processing system 205 to make selections of combinations of outcomes for one or more conditional events 275 to occur during a live sporting event. These combinations can be utilized to place a parlay wager on the combinations. The selections of one or more conditions events may include Boolean operations (e.g., player A OR player B will score the first touchdown in the live event, player A will score the first touchdown AND player B will score the second touchdown in the live event, etc.). The odds values for these mutually exclusive events may be based upon characteristics of the players or the live event, or the simulation results 280 of the live event. Example selections of combinations of conditional events 275 are shown in FIGS. 3A-3H.

Figure 3E:
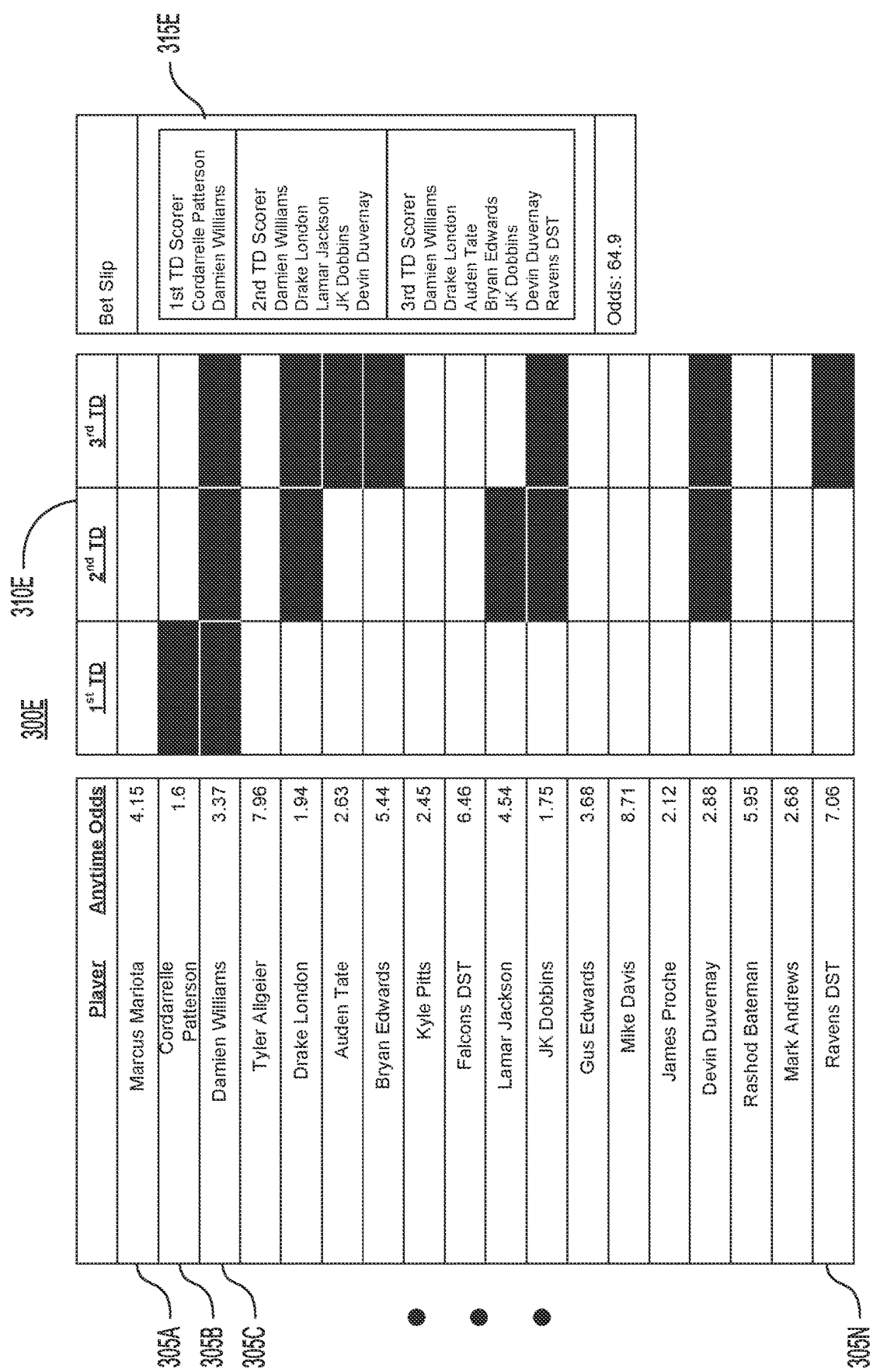

Referring to FIGS. 3A-3H in the context of the components described in connection with FIG. 2, illustrated are example user interfaces 300A-300H showing selected combinations of outcomes of specified conditional events 275 and corresponding odds values as generated by the system of FIG. 2, in accordance with one or more implementations. FIG. 3A shows an example user interface 300A that enables a user to select one or more outcomes for a conditional event 275. In the example of the user interface 300A, the conditional event 275 is the player who will score the first touchdown in an upcoming live event (e.g., an upcoming football game). Although not shown here, it should be understood that the conditional events 275 for which the user can make selections may be selected via a client device 220 using a different user interface, or by interacting with a corresponding interactive user interface element (e.g., an actionable object) of the user interface 300A. Some example actionable objects that enable the user to specify the conditional events 275 for which to select outcomes can include drop-down menus, interactive buttons, hyperlinks, search bars, or other types of graphical user interface elements.

As shown, the user interface 300A includes a list of players 305A-305N (sometimes referred to as the list of players 305 or the players 305). Each of the players 305 can be athletes participating in the live event to which the conditional event corresponds. The table 310A shows the conditional event (e.g., who will score the first touchdown in the live event). Each entry in the table 310A (shown as the boxes in the table) can correspond to a respective player. When an entry (e.g., a box, sometimes referred to as an "actionable object") in the table is selected, it can indicate a user selection of the outcome for the conditional event 275 corresponding to the box row. In this example user interface 300A, the candidate outcomes indicate each player that the user has selected will perform the first touchdown of the football game. Multiple players can be selected by interacting with multiple boxes in the table 310A, indicating a Boolean OR between the possible outcomes for the corresponding conditional event 275. In this example, this can indicate that the win condition of the corresponding leg of the parlay wager is satisfied if any of the selected players have performed the first touchdown.

In some implementations, certain actionable objects may not be selectable, for example, if the corresponding player is incapable of satisfying the corresponding conditional event 275. The un-selectable actionable objects can include an indicator that the respective actionable object is un-selectable (e.g., displayed in a different color, a message or symbol, etc.). As shown, the corresponding actionable objects for each outcome are arranged in columns, with each column corresponding to a respective conditional event 275.

In the user interface 300A, only the player Cordarrelle Patterson has been selected in the table 310A as performing the respective touchdown. As shown, each athlete in the player list 305 includes corresponding "anytime odds," which in this example indicate the odds of the respective player performing a touchdown at any time in the game. These "anytime odds" can be generated by the data processing system 205 using techniques similar to those described herein for the odds of parlay wagers (e.g., by filtering the simulation results 280 and dividing by the total number of simulations of the live event, etc.). Once selections have been made in the table 310A, the data processing system 205 can generate a bet slip 315A that includes the odds values for the combination of selected outcomes for the specified conditional events 275. As shown in the bet slip 315A, only one selection has been made with odds of 9.67. The odds values for the selected player are different from the "anytime odds" for the selected player, because the anytime odds indicate the odds of the player making a touchdown at anytime during the game, rather than the first touchdown (which in this example is the conditional event 275).

FIG. 3B shows an example user interface 300B, which can be similar to the user interface 300A. The user interface 300B can be the user interface 300A after a user has made multiple selections of players to perform the first touchdown during the game. As shown in the table 310B, three players have been selected. Additionally, the bet slip has been updated to reflect the selections of the players for the parlay wager. Note that the odds for the parlay wager shown in FIG. 3B are lower than the odds of the wager in FIG. 3A, because the there is a greater chance that any one of the selected athletes will score the first touchdown than a single athlete.

FIG. 3C shows an example user interface 300C, which can be similar to the user interface 300A. The user interface 300C shows the list of players 305, and a table 310C that includes multiple mutually exclusive conditional events. As shown in the table 310C, three conditional events 275 are shown (e.g., who will score the first touchdown, who will score the second touchdown, and who will score the third touchdown). In this example, one respective player has been selected as a candidate outcome for each of the three conditional events 275. As shown in the corresponding bet slip 315C, this results in very high odds, because there is a very low probability of each of the selected athletes performing the first, second, and third touchdowns in the specified order. The conditional events 275 of the table 310C may be displayed in response to a corresponding selection of the conditional events via one or more respective user interface elements (not shown). In some implementations, certain conditional events 275 may not have a possible outcome for every athlete, and in such implementations, the actionable objects corresponding to invalid players may be "grayed out" or otherwise not selectable.

FIG. 3D shows an example user interface 300D, which can be similar to the user interface 300C. The user interface 300D can be the user interface 300C after a user has made multiple selections of players to perform the first, second, and third touchdowns during the football game. As shown in the table 310D, additional players have been selected for each of the respective touchdowns. Additionally, the bet slip 315D has been updated to reflect the selections of the players for the parlay wager. Note that the odds for the parlay wager shown in FIG. 3D are lower than the odds of the wager in FIG. 3C, because the there is a greater chance that any one of the selected athletes will score the first, second, and third touchdowns than a single athlete scoring all three touchdowns.

Although FIG. 3D shows selections of multiple athletes performing the first second, and third touchdowns, it should be understood that any combination of athletes can be selected as performing one or more of the specified conditional events 275. An example of this is shown in FIG. 3E, which shows an example user interface 300E. The user interface 300E shows the list of players 305 and the table 310E, which shows differing selections for each of the first, second, and third touchdowns. As shown, different combinations of athletes can be selected for each of the first, second, and third touchdowns, and the bet slip has been updated to list both the player selections and the odds value for the parlay wager.

Figure 3H:
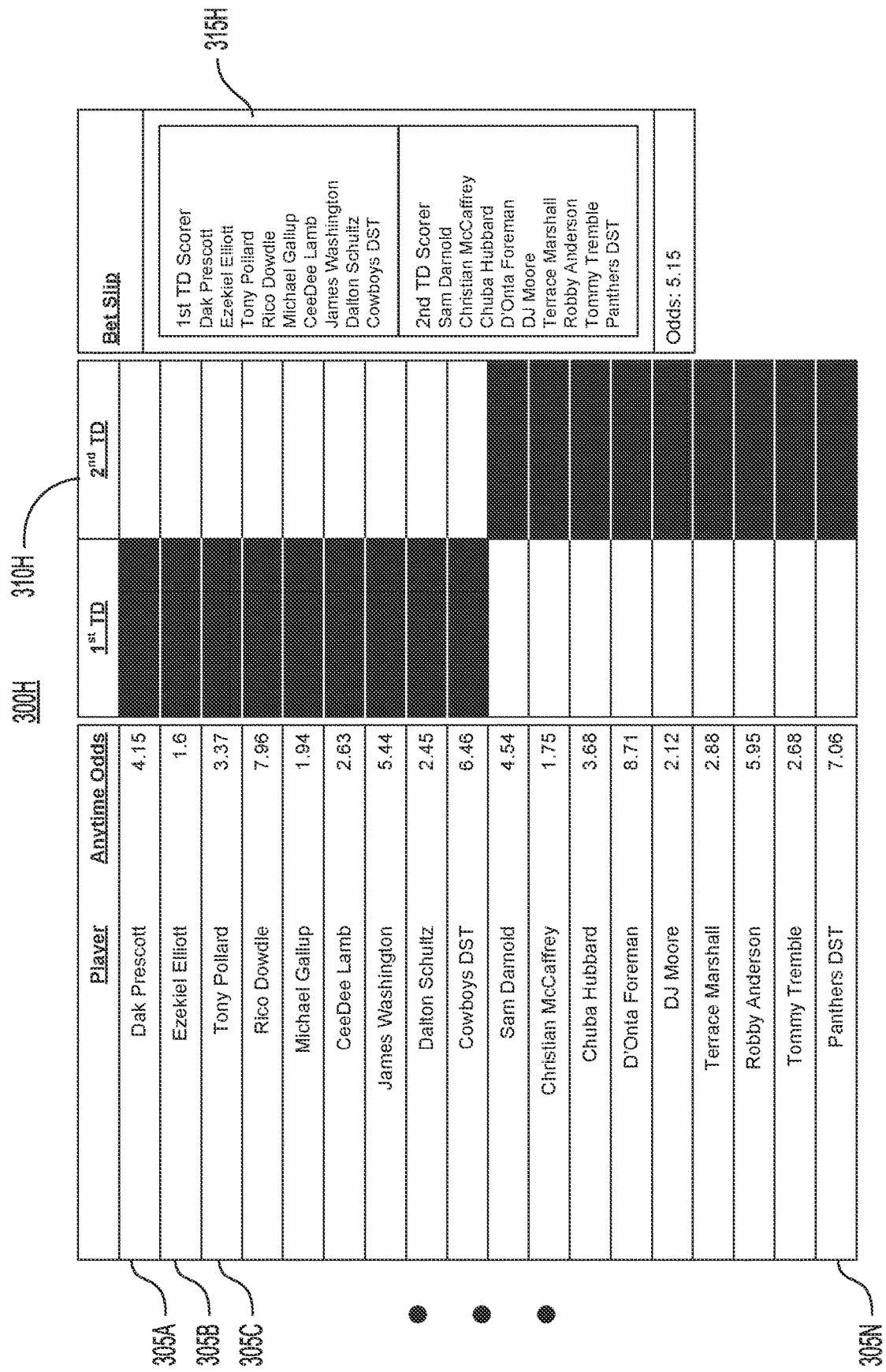

FIGS. 3F, 3G, and 3H show the user interfaces 300F, 300G, and 300H, each of which include different numbers of possible conditional events 275 (in these examples, who will score the first, second, third, or fourth touchdowns in a football game) in corresponding tables 310F, 310G, and 310H. Based on the corresponding selections, the bet slips 315F, 315G, and 315H have been generated or updated by the data processing system 205 to include the odds values for the respective parlay wagers as described herein. Although not shown here for visual simplicity, each of the user interfaces of FIGS. 3A-3H can include one or more actionable objects that cause the client device 220 to transmit a request to place the selected parlay wager indicated on the respective bet slip 315A-315H. The actionable objects can include any wager information described herein, including a wager amount, additional wager conditions, or an identifier of a player profile 270, among other features. In response to the request, the data processing system 205 can update the player profile 270 via which the wager was placed.

The data processing system 205 can credit an account specified in the player profile 270 based on the odds and an actual outcome of the conditional events 275 in the parlay wager as they occur in the game. For example, the data processing system 205 may monitor one or more outcomes of the conditional events 275 in the game based upon wagers placed via one or more client devices 220. In some implementations, the actual outcomes of the conditional events 275 can be monitored by an external source (e.g., a third party, an external computing system, etc.) that communicates the actual outcomes of the conditional events 275 to the data processing system 205.

Although not shown in FIGS. 3A-3H, it should be understood that similar user interfaces may be utilized to assemble parlay wagers based on conditional events 275 of multiple games. For example, a parlay wager may be assembled based upon who scores the first touchdown in two or more football games. The live events, conditional events 275, and candidate outcomes for the conditional events 275 can be selected by a player using techniques similar to those described herein, and may be utilized to assemble parlay wagers for multiple conditional events 275, for multiple outcomes, and for multiple live events that may be concurrent or subsequent to one another. Any type of possible parlay wager may be generated using the present techniques, and the data processing system 205 can utilize the selected candidate outcomes of the conditional events 275 and the simulation results 280 to generate odds values for the parlay wager, as described in further detail herein.

Referring back to FIG. 2, once the candidate outcomes of the conditional events 275 of one or more live events have been selected, the subset identifier 240 can identify, from the simulation results 280, a subset of the simulation results 280 that include the outcomes selected via the user interfaces. In doing so, the subset identifier 240 can identify the number of simulations, from a superset of simulations of the one or more live events, which include the selected outcome for the parlay wager. To identify the subset of the simulations, the subset identifier 240 can filter the data structure(s) storing the simulation results 280 for the one or more live events based on a first candidate outcome of a first conditional event 275 of the parlay wager to generate an initial subset of simulations. Then, the subset identifier 240 can repeatedly filter the initial subset to generate further subsets (which are also iteratively filtered) based on additional selected candidate outcomes of any additional conditional events in the parlay wager. In some implementations, if the simulation results 280 are structured as a database, the subset identifier 240 can generate one or more database queries (e.g., an SQL query, a NoSQL query, etc.) that return the simulation results 280 (and therefore the number of simulations) that corresponds to the selected outcomes of the conditional events 275 in the parlay wager.

In implementations where the simulation results include a counter for each possible outcome of the candidate events 275, the subset identifier 240 can identify the respective counter value for each outcome in the simulation results 280 that indicates the selected outcomes of the candidate event 275. If the outcomes correspond to a Boolean OR operation, the subset identifier 240 can increment the counters. If the outcomes correspond to a Boolean AND operation, the subset identifier 240 can recalculate the counter values for each subset of simulation results 280 in each subset. The subset identifier 240 can iteratively filter each subset as described herein, and recalculate the corresponding counter value, to determine the number of simulations that satisfy the outcomes selected by the player for the parlay wager via the user interfaces described herein. For example, the subset identifier can determine the subset of simulations in which the selected players selected by the user scored the first touchdown (e.g., if the first touchdown is the conditional event 275 in the parlay wager).

Upon determining the number of simulations that satisfy the selected outcomes of the parlay wager based on the simulation results 280, the odds value generator 245 can generate an odds value for the parlay wager. The odds value can be calculated as a function of the number of the simulations having outcomes that satisfy the parlay wager (e.g., the number of the subset of simulations that satisfy the subset) and the total number simulations of the one or more live events indicated in the parlay wager. For example, the probability of the parlay wager being satisfied can be calculated by dividing the number of the subset of simulations in which the parlay bet was satisfied by the total number of simulations of the corresponding live events. The odds value (e.g., a payout multiplier, etc.) can then be calculated based on this probability. Removing entire simulations with each evaluation implicitly deals with the correlation across markets, without requiring brute-force probability determinations for every combination of possible outcomes in the parlay wager. The combinations of possible outcomes in brute-force techniques increase exponentially as the number of conditional events 275 (and the selected outcomes corresponding thereto) increase. Therefore, the techniques described herein that utilize filtering of the simulation results 280 provide a technical improvement to probability determination systems due to the increased efficiency of filtering the simulation results 280. Filtering the simulation results 280 can be used to calculate the probability of combinations of outcomes of conditional events 275 of arbitrary complexity with little or no decrease in performance. This enables the real-time or near real-time calculation of odds values for complex parlay wagers.

Once the odds value for the selected parlay wager has been generated, the user interface presenter 250 can provide the odds value for presentation at the user interface (e.g., user interfaces similar to those described in connection with FIGS. 3A-3H) at the client device 220. The odds value may be presented in a bet slip, as shown in the user interfaces 300A-300H of FIGS. 3A-3H. In some implementations, the odds values can be provided to the client device 220 by dynamically updating the user interface, for example, in response to an interaction with a corresponding button displayed in the user interface (e.g., a calculate odds button, etc.). In some implementations, the odds value can be stored in association with an identifier of the parlay wager. Displaying the odds value can include updating the user interface (e.g., by transmitting display instructions, etc.) to include a button that, when interacted with, causes the client device 220 to transmit a request to place the parlay wager assembled based the selections of candidate outcomes for the specified conditional events 275. Upon receiving the request, the data processing system 205 can update the player profile 270 used to access the functionality of the data processing system 205 with a record of the parlay wager and can monitor the conditional events 275 of the parlay wager as they occur in the corresponding live event(s), as described herein.

Figure 4:
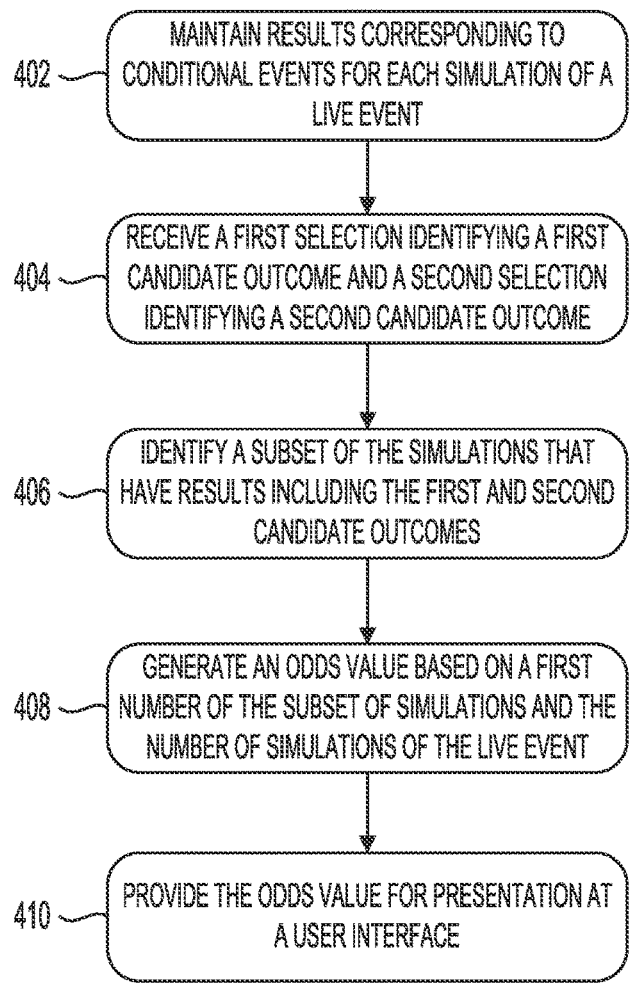
FIG. 4 illustrates an example flow diagram of a method for modeling live events, in accordance with one or more implementations.

Referring now to FIG. 4, depicted is an illustrative flow diagram of a method 400 for modeling live events. The method 400 can be executed, performed, or otherwise carried out by the data processing system 205, the computer system 100 described herein in conjunction with FIGS. 1A-1D, or any other computing devices described herein. In brief overview of the method 400, the data processing system (e.g., the data processing system 205, etc.) can maintain simulation results (e.g., the simulation results 280) corresponding to conditional events (e.g., the conditional events 275) for simulations of a live event (STEP 402), receive selections of candidate outcomes of one or more conditional events of the live event (STEP 404), identify a subset of the simulations that have results including the selected candidate outcomes (STEP 406), generate an odds value for a parlay wager including the selected outcomes based on a number of the subset of simulations and the (STEP 408), and provide the odds value for presentation at a user interface (STEP 410).

In further detail of the method 400, the data processing system (e.g., the data processing system 205, etc.) can maintain simulation results (e.g., the simulation results 280) corresponding to conditional events (e.g., the conditional events 275) for simulations of a live event (STEP 402). For example, the data processing system can maintain one or more data structures that include the simulation results, which may be stored in association with respective identifiers of respective conditional events, as described herein. In some implementations, the simulation results for a particular conditional event can include respective counter values that correspond to a count of each outcome for each simulation of the corresponding live event. The data processing system can calculate or generate the counter values for each conditional event of a live event by scanning through the simulation results of the simulations of the live event, or may receive (or retrieve, from a storage (e.g., the storage 215) of the data processing system) the counter values as part of the simulation results from an external computing system that executed the simulations of the live event.

In some implementations, the data processing system can itself generate the simulation results for a live event by executing simulations of the live event. A simulation of a live event can be a model of the event and can produce one or more outputs that correspond to various outcomes of the live event. For example, if the live event is a sporting event, the outcomes may include timestamps of simulated game events (e.g., points scored, passes made, etc.), along with identifiers of participants (e.g., athletes) that performed the simulated game event. Executing the simulations can include executing processor-readable instructions that cause the data processing system to carry out a model of the live event, with the outputs of the simulation being respective simulation results for each conditional event of the live event, as described herein. Each simulation used to generate the simulation results may depend partially on an element of randomness (e.g., one or more random numbers generated using one or more random number generators), and may be based on various aspects of the particular live event, such as the teams and athletes participating in the live event or any other attribute or characteristic that may influence any outcome that may occur during the live event. As such, the simulation results generated from each simulation may include different outcomes for the conditional events of the simulated live event.

The data processing system can execute a predetermined number of simulations of the live event, for example. The predetermined number may be specified in one or more requests from an external computing device (e.g., a client device (e.g., a client device 220), an administrative computing system, an operator of the data processing system, etc.). In some implementations, one or more of the simulations of the live event can be executed by an external computing system (not pictured), which can store corresponding simulation results in the storage of the data processing system, as described herein. The data processing system can generate counter values for each outcome of each conditional event of the live event to which the simulations correspond. To so, the data processing system can update a respective counter value for each conditional event based on the various outcomes indicated in the simulation results for the live event. The simulations of the live event can be executed as an offline process (e.g., prior to the live event, not in real-time or near real-time, etc.). The simulation results can be maintained to perform the estimation of odds values for parlay wagers or other combinations of candidate outcomes of conditional events, as described herein.

The data processing system can receive selections of candidate outcomes of one or more conditional events of the live event (STEP 404). The selections can be received, for example, via a user interface (e.g., user interfaces provided by the data processing system similar to those described in connection with FIGS. 3A-3H, etc.) presented at a client device. As described herein, particular wagers, such as parlay wagers, can include wagers on multiple mutually exclusive conditional events. The odds values for such wagers can be calculated across two correlated markets, containing a number of mutually exclusive outcomes of conditional events. The client device can access a webpage or application resource provided by the data processing system to make selections of combinations of outcomes for one or more conditional events to occur during a live sporting event. These combinations can be utilized to place a parlay wager on the combinations. The selections of one or more conditions events may include Boolean operations (e.g., player A OR player B will score the first touchdown in the live event, player A will score the first touchdown AND player B will score the second touchdown in the live event, etc.). The odds values for these mutually exclusive events may be based upon characteristics of the players or the live event, or the simulation results of the live event. Example selections of combinations of conditional events are shown in FIGS. 3A-3H.

The data processing system can identify a subset of the simulations that have results including the selected candidate outcomes (STEP 406). Once the candidate outcomes of the conditional events of one or more live events have been selected, the data processing system can identify, from the simulation results, a subset of the simulation results that include the outcomes selected via the user interfaces. In doing so, the data processing system can identify the number of simulations, from a superset of simulations of the one or more live events, which include the selected outcome for the parlay wager. To identify the subset of the simulations, the data processing system can filter the data structure(s) storing the simulation results for the one or more live events based on a first candidate outcome of a first conditional event of the parlay wager to generate an initial subset of simulations. Then, the data processing system can repeatedly filter the initial subset to generate further subsets (which are also iteratively filtered) based on additional selected candidate outcomes of any additional conditional events in the parlay wager. In some implementations, if the simulation results are structured as a database, the data processing system can generate one or more database queries (e.g., an SQL query, a NoSQL query, etc.) that return the simulation results (and therefore the number of simulations) that corresponds to the selected outcomes of the conditional events in the parlay wager.

In implementations where the simulation results include a counter for each possible outcome of the candidate events, the data processing system can identify the respective counter value for each outcome in the simulation results that indicates the selected outcomes of the candidate event. If the outcomes correspond to a Boolean OR operation, the data processing system can increment the counters. If the outcomes correspond to a Boolean AND operation, the data processing system can recalculate the counter values for each subset of simulation results in each subset. The data processing system can iteratively filter each subset as described herein, and recalculate the corresponding counter value, to determine the number of simulations that satisfy the outcomes selected by the player for the parlay wager via the user interfaces described herein. For example, the data processing system can determine the subset of simulations in which the selected players selected by the user scored the first touchdown (e.g., if the first touchdown is the conditional event in the parlay wager).

The data processing system can generate an odds value for a parlay wager including the selected outcomes based on a number of the subset of simulations and the (STEP 408). Upon determining the number of simulations that satisfy the selected outcomes of the parlay wager based on the simulation results, the data processing system can generate an odds value for the parlay wager. The odds value can be calculated as a function of the number of the simulations having outcomes that satisfy the parlay wager (e.g., the number of the subset of simulations that satisfy the subset) and the total number simulations of the one or more live events indicated in the parlay wager. For example, the probability of the parlay wager being satisfied can be calculated by dividing the number of the subset of simulations in which the parlay bet was satisfied by the total number of simulations of the corresponding live events. The odds value (e.g., a payout multiplier, etc.) can then be calculated based on this probability. Removing entire simulations with each evaluation implicitly deals with the correlation across markets, without requiring brute-force probability determinations for every combination of possible outcomes in the parlay wager. The combinations of possible outcomes in brute-force techniques increase exponentially as the number of conditional events (and the selected outcomes corresponding thereto) increase. Therefore, the techniques described herein that utilize filtering of the simulation results provide a technical improvement to probability determination systems due to the increased efficiency of filtering the simulation results. Filtering the simulation results can be used to calculate the probability of combinations of outcomes of conditional events of arbitrary complexity with little or no decrease in performance. This enables the real-time or near real-time calculation of odds values for complex parlay wagers.

The data processing system can provide the odds value for presentation at a user interface (STEP 410). Once the odds value for the selected parlay wager has been generated, the data processing system can provide the odds value for presentation at the user interface (e.g., user interfaces similar to those described in connection with FIGS. 3A-3H) at the client device. The odds value may be presented in a bet slip, as shown in the user interfaces 300A-300H of FIGS. 3A-3H. In some implementations, the odds values can be provided to the client device by dynamically updating the user interface, for example, in response to an interaction with a corresponding button displayed in the user interface (e.g., a calculate odds button, etc.). In some implementations, the odds value can be stored in association with an identifier of the parlay wager. Displaying the odds value can include updating the user interface (e.g., by transmitting display instructions, etc.) to include a button that, when interacted with, causes the client device to transmit a request to place the parlay wager assembled based the selections of candidate outcomes for the specified conditional events. Upon receiving the request, the data processing system 205 can update the player profile used to access the functionality of the data processing system 205 with a record of the parlay wager and can monitor the conditional events of the parlay wager as they occur in the corresponding live event(s), as described herein.

Implementations of the subject matter and the operations described in this specification can be implemented in digital electronic circuitry, or in computer software embodied on a tangible medium, firmware, or hardware, including the structures disclosed in this specification and their structural equivalents, or in combinations of one or more of them. Implementations of the subject matter described in this specification can be implemented as one or more computer programs, e.g., one or more components of computer program instructions, encoded on computer storage medium for execution by, or to control the operation of, data processing apparatus. The program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can include a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The terms "data processing apparatus," "data processing system," "client device," "computing platform," "computing device," or "device" encompass all kinds of apparatuses, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The elements of a computer include a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. A computer, however, need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive). Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube), plasma, or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can include any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), an inter-network (e.g., the Internet), and peer-to-peer networks (e.g., ad hoc peer-to-peer networks).

The computing system such as the data processing system 205 can include clients and servers. For example, the data processing system 205 can include one or more servers in one or more data centers or server farms. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving input from a user interacting with the client device). Data generated at the client device (e.g., a result of an interaction, computation, or any other event or computation) can be received from the client device at the server, and vice versa.

While this specification contains many specific implementation details, these should not be construed as limitations on the scope of any inventions or of what may be claimed, but rather as descriptions of features specific to particular implementations of the systems and methods described herein. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In some cases, the actions recited in the claims can be performed in a different order and still achieve desirable results. In addition, the processes depicted in the accompanying figures do not necessarily require the particular order shown, or sequential order, to achieve desirable results.

In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. For example, the data processing system 205 could be a single module, a logic device having one or more processing modules, one or more servers, or part of a search engine.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements, and features discussed only in connection with one implementation are not intended to be excluded from a similar role in other implementations.

The phraseology and terminology used herein is for the purpose of description and should not be regarded as limiting. The use of "including," "comprising," "having," "containing," "involving," "characterized by," "characterized in that," and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation, element, or act herein may also embrace implementations including only a single element. References in the singular or plural form are not intended to limit the presently disclosed systems or methods, their components, acts, or elements to single or plural configurations. References to any act or element being based on any information, act, or element may include implementations where the act or element is based at least in part on any information, act, or element.

Any implementation disclosed herein may be combined with any other implementation, and references to "an implementation," "some implementations," "an alternate implementation," "various implementation," "one implementation," or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. Although the examples provided may be useful for modeling live events, the systems and methods described herein may be applied to other environments. The foregoing implementations are illustrative rather than limiting of the described systems and methods. The scope of the systems and methods described herein may thus be indicated by the appended claims, rather than the foregoing description, and changes that come within the meaning and range of equivalency of the claims are embraced therein.

What is claimed is:

1. A method, comprising:
maintaining, by one or more processors coupled to a non-transitory memory, for each simulation of a plurality of simulations of a live event, a plurality of results corresponding to a plurality of conditional events that occur during the simulation;
receiving, by the one or more processors, via a user interface presented at a computing device, a first selection identifying a first plurality of candidate outcomes for a first conditional event of the plurality of conditional events to occur during the live event and a second selection identifying a second candidate outcome for a second conditional event of the plurality of conditional events to occur during the live event, the second conditional event occurring subsequent to the first conditional event;
identifying, by the one or more processors, from the plurality of simulations, a subset of simulations having a subset of the plurality of results that include (i) any of the first plurality of candidate outcomes and (ii) the second candidate outcome;
generating, by the one or more processors, an odds value based on a first number of simulations included in the subset of simulations and a second number of simulations included in the plurality of simulations; and
providing, by the one or more processors, the odds value for presentation at the user interface at the computing device.

2. The method of claim 1, wherein maintaining the plurality of results comprises maintaining, by the one or more processors, a data structure comprising the plurality of results stored in association with respective identifiers of each of the plurality of conditional events.

3. The method of claim 2, wherein identifying the subset of simulations comprises:
filtering, by the one or more processors, the data structure based on the first plurality of candidate outcomes to generate an initial subset of simulations; and
filtering, by the one or more processors, the initial subset of simulations based on the second candidate outcome to generate the subset of simulations.

4. The method of claim 1, wherein each result of the plurality of results comprises a respective counter value corresponding to a count of outcomes during the plurality of simulations.

5. The method of claim 4, wherein identifying the subset of simulations comprises identifying, by the one or more processors, the respective counter value of each of the plurality of results that indicates (i) any of the first plurality of candidate outcomes or (ii) the second candidate outcome.

6. The method of claim 1, wherein the live event is a sporting event, and the method further comprises:

generating, by the one or more processors, the plurality of results by executing the plurality of simulations of the sporting event; and
updating, by the one or more processors, a respective counter value for each of the plurality of conditional events based on a respective output of the plurality of simulations.

7. The method of claim 1, wherein the live event is a sporting event, and wherein the first selection of the first plurality of candidate outcomes comprise a selection of a plurality of players for the first conditional event of the sporting event.

8. The method of claim 7, wherein identifying the subset of simulations is further based on the plurality of players.

9. The method of claim 1, further comprising providing, by the one or more processors to the computing device, instructions to display the user interface, the user interface comprising a plurality of actionable objects, wherein the first selection identifying the first plurality of candidate outcomes is provided responsive to respective interactions with a subset of the plurality of actionable objects.

10. The method of claim 9, wherein the plurality of actionable objects are arranged in a first column at the user interface, and a second plurality of actionable objects corresponding to the second conditional event are arranged in a second column in the user interface.

11. A system, comprising:
one or more processors coupled to a non-transitory memory, the one or more processors configured to:
maintain, for each simulation of a plurality of simulations of a live event, a plurality of results corresponding to a plurality of conditional events that occur during the simulation;
receive, via a user interface presented at a computing device, a first selection identifying a first plurality of candidate outcomes for a first conditional event of the plurality of conditional events to occur during the live event and a second selection identifying a second candidate outcome for a second conditional event of the plurality of conditional events to occur during the live event, the second conditional event occurring subsequent to the first conditional event;
identify, from the plurality of simulations, a subset of simulations having a subset of the plurality of results that include (i) any of the first plurality of candidate outcomes and (ii) the second candidate outcome;
generate an odds value based on a first number of simulations included in the subset of simulations and a second number of simulations included in the plurality of simulations; and
provide the odds value for presentation at the user interface at the computing device.

12. The system of claim 11, wherein the one or more processors are further configured to maintain a data structure comprising the plurality of results stored in association with respective identifiers of each of the plurality of conditional events.

13. The system of claim 12, wherein the one or more processors are further configured to identify the subset of simulations by performing operations comprising:
filtering the data structure based on the first plurality of candidate outcomes to generate an initial subset of simulations; and
filtering the initial subset of simulations based on the second candidate outcome to generate the subset of simulations.

14. The system of claim 11, wherein each result of the plurality of results comprises a respective counter value corresponding to a count of outcomes during the plurality of simulations.

15. The system of claim 14, wherein the one or more processors are further configured to identify the subset of simulations by performing operations comprising identifying the respective counter value of each of the plurality of results that indicates (i) any of the first plurality of candidate outcomes or (ii) the second candidate outcome.

16. The system of claim 11, wherein the live event is a sporting event, and the one or more processors are further configured to:
    generate the plurality of results by executing the plurality of simulations of the sporting event; and
    generate the plurality of results by performing operations comprising updating a respective counter value for each of the plurality of conditional events based on a respective output of the plurality of simulations.

17. The system of claim 11, wherein the live event is a sporting event, and wherein the first selection of the first plurality of candidate outcomes comprises a selection of a plurality of players for the first conditional event of the live event.

18. The system of claim 17, wherein the one or more processors are further configured to identify the subset of simulations further based on the plurality of players.

19. The system of claim 11, wherein the one or more processors are further configured to provide, to the computing device, instructions to display the user interface, the user interface comprising a plurality of actionable objects, wherein the first selection identifying the first plurality of candidate outcomes is provided responsive to respective interactions with a subset of the plurality of actionable objects.

20. The system of claim 19, wherein the plurality of actionable objects are arranged in a first column at the user interface, and a second plurality of actionable objects corresponding to the second conditional event are arranged in a second column in the user interface.

* * * * *